US009686870B2

(12) United States Patent
Teh et al.

(10) Patent No.: US 9,686,870 B2
(45) Date of Patent: Jun. 20, 2017

(54) METHOD OF FORMING A MICROELECTRONIC DEVICE PACKAGE

(71) Applicant: Intel Corporation, Santa Clara, CA (US)

(72) Inventors: Weng Hong Teh, Cambridge, MA (US); John S. Guzek, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 254 days.

(21) Appl. No.: 14/566,198

(22) Filed: Dec. 10, 2014

(65) Prior Publication Data
US 2015/0135526 A1 May 21, 2015

Related U.S. Application Data

(62) Division of application No. 13/169,162, filed on Jun. 27, 2011, now Pat. No. 8,937,382.

(51) Int. Cl.
*H05K 3/32* (2006.01)
*H01L 23/31* (2006.01)
(Continued)

(52) U.S. Cl.
CPC ............ *H05K 3/32* (2013.01); *H01L 21/561* (2013.01); *H01L 21/568* (2013.01);
(Continued)

(58) Field of Classification Search
CPC ....... H05K 3/32; H01L 21/561; H01L 21/568; H01L 21/6835; H01L 24/19; H01L 24/20; H01L 24/82; H01L 2221/68372; H01L 2924/14; H01L 2924/01006; H01L 2924/01029; H01L 2924/12042; H01L 2924/1815; H01L 2924/18162; H01L 2924/32245; H01L 2224/82001;
(Continued)

(56) References Cited

U.S. PATENT DOCUMENTS 4,921,160 A    5/1990  Flynn et al.
5,353,498 A   10/1994  Fillion et al.
(Continued)

FOREIGN PATENT DOCUMENTS

CN       101952959 A      1/2011
JP         5166623 A  *   7/1993
(Continued)

OTHER PUBLICATIONS

Office Action received for Chinese Patent Application No. 201280032156.7, mailed on Oct. 28, 2015, 6 pages of Chinese Office Action only.
(Continued)

*Primary Examiner* — Carl Arbes
(74) *Attorney, Agent, or Firm* — Winkle, PLLC

(57) ABSTRACT

The present disclosure relates to the field of fabricating microelectronic device packages and, more particularly, to microelectronic device packages having bumpless build-up layer (BBUL) designs, wherein at least one secondary device is disposed within the thickness (i.e. the z-direction or z-height) of the microelectronic device of the microelectronic device package.

18 Claims, 25 Drawing Sheets

(51) Int. Cl.
  *H01L 21/56* (2006.01)
  *H01L 23/00* (2006.01)
  *H01L 21/683* (2006.01)

(52) U.S. Cl.
  CPC ...... *H01L 21/6835* (2013.01); *H01L 23/3121* (2013.01); *H01L 24/19* (2013.01); *H01L 24/20* (2013.01); *H01L 24/24* (2013.01); *H01L 24/82* (2013.01); *H01L 2221/68372* (2013.01); *H01L 2224/32245* (2013.01); *H01L 2224/82001* (2013.01); *H01L 2224/82002* (2013.01); *H01L 2224/92244* (2013.01); *H01L 2924/01006* (2013.01); *H01L 2924/01029* (2013.01); *H01L 2924/12042* (2013.01); *H01L 2924/14* (2013.01); *H01L 2924/1815* (2013.01); *H01L 2924/18162* (2013.01); *Y10T 29/4913* (2015.01); *Y10T 29/49117* (2015.01)

(58) Field of Classification Search
  CPC . H01L 2224/82002; H01L 2224/92244; H01L 23/3121; Y29T 29/49117
  See application file for complete search history.

(56) References Cited

U.S. PATENT DOCUMENTS

| | | |
|---|---|---|
| 5,497,033 A | 3/1996 | Fillion et al. |
| 5,510,649 A | 4/1996 | Adhihetty et al. |
| 5,527,741 A | 6/1996 | Cole et al. |
| 5,841,193 A | 11/1998 | Eichelberger |
| 6,154,366 A | 11/2000 | Ma et al. |
| 6,159,767 A | 12/2000 | Eichelberger |
| 6,239,482 B1 | 5/2001 | Fillion et al. |
| 6,242,282 B1 | 6/2001 | Fillion et al. |
| 6,271,469 B1 | 8/2001 | Ma et al. |
| 6,306,680 B1 | 10/2001 | Fillion et al. |
| 6,396,148 B1 | 5/2002 | Eichelberger et al. |
| 6,396,153 B2 | 5/2002 | Fillion et al. |
| 6,423,570 B1 | 7/2002 | Ma et al. |
| 6,426,545 B1 | 7/2002 | Eichelberger et al. |
| 6,472,762 B1 | 10/2002 | Kutlu |
| 6,489,185 B1 | 12/2002 | Towle et al. |
| 6,507,122 B2 | 1/2003 | Blackshear |
| 6,555,906 B2 | 4/2003 | Towle et al. |
| 6,555,908 B1 | 4/2003 | Eichelberger et al. |
| 6,580,611 B1 | 6/2003 | Vandentop et al. |
| 6,586,276 B2 | 7/2003 | Towle et al. |
| 6,586,822 B1 | 7/2003 | Vu et al. |
| 6,586,836 B1 | 7/2003 | Ma et al. |
| 6,617,682 B1 | 9/2003 | Ma et al. |
| 6,703,400 B2 | 3/2004 | Johnson et al. |
| 6,706,553 B2 | 3/2004 | Towle et al. |
| 6,709,898 B1 | 3/2004 | Ma et al. |
| 6,713,859 B1 | 3/2004 | Ma |
| 6,734,534 B1 | 5/2004 | Vu et al. |
| 6,794,223 B2 | 9/2004 | Ma et al. |
| 6,818,544 B2 | 11/2004 | Eichelberger et al. |
| 6,825,063 B2 | 11/2004 | Vu et al. |
| 6,841,413 B2 | 1/2005 | Liu et al. |
| 6,888,240 B2 | 5/2005 | Towle et al. |
| 6,894,399 B2 | 5/2005 | Vu et al. |
| 6,902,950 B2 | 6/2005 | Ma et al. |
| 6,964,889 B2 | 11/2005 | Ma et al. |
| 7,067,356 B2 | 6/2006 | Towle et al. |
| 7,071,024 B2 | 7/2006 | Towle et al. |
| 7,078,788 B2 | 7/2006 | Vu et al. |
| 7,109,055 B2 | 9/2006 | McDonald et al. |
| 7,112,467 B2 | 9/2006 | Eichelberger et al. |
| 7,144,756 B1 | 12/2006 | Wang et al. |
| 7,160,755 B2 | 1/2007 | Lo et al. |
| 7,183,658 B2 | 2/2007 | Towle et al. |
| 7,189,596 B1 | 3/2007 | Mu et al. |
| 7,416,918 B2 | 8/2008 | Ma |
| 7,420,273 B2 | 9/2008 | Liu et al. |
| 7,425,464 B2 | 9/2008 | Fay et al. |
| 7,442,581 B2 | 10/2008 | Lytle et al. |
| 7,459,782 B1 | 12/2008 | Li |
| 7,476,563 B2 | 1/2009 | Mangrum et al. |
| 7,588,951 B2 | 9/2009 | Mangrum et al. |
| 7,595,226 B2 | 9/2009 | Lytle et al. |
| 7,619,901 B2 | 11/2009 | Eichelberger et al. |
| 7,632,715 B2 | 12/2009 | Hess et al. |
| 7,633,143 B1 | 12/2009 | Fan |
| 7,648,858 B2 | 1/2010 | Tang et al. |
| 7,651,889 B2 | 1/2010 | Tang et al. |
| 7,655,502 B2 | 2/2010 | Mangrum et al. |
| 7,659,143 B2 | 2/2010 | Tang et al. |
| 7,723,164 B2 | 5/2010 | Lu et al. |
| 7,851,905 B2 | 12/2010 | Chrysler et al. |
| 8,035,216 B2 | 10/2011 | Skeete |
| 8,093,704 B2 | 1/2012 | Palmer et al. |
| 8,105,934 B2 | 1/2012 | Kwon et al. |
| 8,264,849 B2 | 9/2012 | Guzek |
| 8,304,913 B2 | 11/2012 | Nalla et al. |
| 8,319,318 B2 | 11/2012 | Nalla et al. |
| 8,497,587 B2 | 7/2013 | Ma |
| 8,535,989 B2 | 9/2013 | Sankman et al. |
| 8,937,382 B2 | 1/2015 | Teh et al. |
| 8,969,140 B2 | 3/2015 | Sankman et al. |
| 2001/0010397 A1 | 8/2001 | Masuda et al. |
| 2001/0015492 A1 | 8/2001 | Akram et al. |
| 2002/0088116 A1 | 7/2002 | Milkovich et al. |
| 2002/0145204 A1 | 10/2002 | Naka et al. |
| 2003/0207495 A1 | 11/2003 | Akram |
| 2004/0262776 A1 | 12/2004 | Lebonheur et al. |
| 2005/0062173 A1 | 3/2005 | Vu et al. |
| 2005/0087356 A1 | 4/2005 | Forcier et al. |
| 2006/0145328 A1 | 7/2006 | Hsu |
| 2006/0151865 A1 | 7/2006 | Han et al. |
| 2006/0186536 A1 | 8/2006 | Hsu |
| 2007/0279885 A1 | 12/2007 | Basavanhally et al. |
| 2008/0029895 A1 | 2/2008 | Hu et al. |
| 2008/0128916 A1 | 6/2008 | Soejima et al. |
| 2008/0308917 A1 | 12/2008 | Pressel et al. |
| 2008/0315377 A1 | 12/2008 | Eichelberger et al. |
| 2008/0315391 A1 | 12/2008 | Kohl et al. |
| 2008/0315398 A1 | 12/2008 | Lo et al. |
| 2009/0072382 A1 | 3/2009 | Guzek |
| 2009/0075428 A1 | 3/2009 | Tang et al. |
| 2009/0079064 A1 | 3/2009 | Tang et al. |
| 2009/0121347 A1 | 5/2009 | Kasai et al. |
| 2009/0152743 A1 | 6/2009 | Jomaa et al. |
| 2009/0212416 A1 | 8/2009 | Skeete |
| 2009/0236031 A1 | 9/2009 | Sunohara et al. |
| 2010/0013101 A1 | 1/2010 | Hedler et al. |
| 2010/0044855 A1 | 2/2010 | Eichelberger et al. |
| 2010/0047970 A1 | 2/2010 | Eichelberger et al. |
| 2010/0073894 A1 | 3/2010 | Mortensen et al. |
| 2010/0127394 A1 | 5/2010 | Ramiah et al. |
| 2010/0216280 A1 | 8/2010 | Smeys et al. |
| 2010/0237481 A1 | 9/2010 | Chi et al. |
| 2011/0089546 A1 | 4/2011 | Bayan |
| 2011/0101491 A1 | 5/2011 | Skeete et al. |
| 2011/0108999 A1 | 5/2011 | Nalla et al. |
| 2011/0121449 A1 | 5/2011 | Lin et al. |
| 2011/0156231 A1 | 6/2011 | Guzek |
| 2011/0156235 A1 | 6/2011 | Yuan |
| 2011/0156261 A1 | 6/2011 | Kapusta et al. |
| 2011/0215464 A1 | 9/2011 | Guzek |
| 2011/0221069 A1 | 9/2011 | Kunimoto |
| 2011/0228464 A1 | 9/2011 | Guzek et al. |
| 2011/0241186 A1 | 10/2011 | Nalla et al. |
| 2011/0241195 A1 | 10/2011 | Nalla et al. |
| 2011/0254124 A1 | 10/2011 | Nalla et al. |
| 2011/0281375 A1 | 11/2011 | Swaminathan et al. |
| 2011/0316140 A1 | 12/2011 | Nalla et al. |
| 2012/0001339 A1 | 1/2012 | Malatkar |
| 2012/0005887 A1 | 1/2012 | Mortensen et al. |
| 2012/0009738 A1 | 1/2012 | Crawford et al. |
| 2012/0074581 A1 | 3/2012 | Guzek et al. |
| 2012/0104583 A1 | 5/2012 | Lee et al. |
| 2012/0112336 A1 | 5/2012 | Guzek et al. |
| 2012/0139095 A1 | 6/2012 | Manusharow et al. |

(56) References Cited

U.S. PATENT DOCUMENTS

| | | |
|---|---|---|
| 2012/0139116 A1 | 6/2012 | Manusharow et al. |
| 2013/0003319 A1 | 1/2013 | Malatkar et al. |
| 2013/0203265 A1 | 8/2013 | Hsiao |
| 2013/0270719 A1 | 10/2013 | Malatkar et al. |
| 2014/0021635 A1 | 1/2014 | Goh et al. |
| 2014/0048959 A1 | 2/2014 | Hu |
| 2014/0363929 A1 | 12/2014 | Malatkar et al. |
| 2015/0145138 A1 | 5/2015 | Sankman et al. |
| 2016/0196988 A1 | 7/2016 | Sankman et al. |

FOREIGN PATENT DOCUMENTS

| | | |
|---|---|---|
| JP | 2003124426 A * | 4/2003 |
| JP | 2004-056093 A | 2/2004 |
| JP | 2004-200201 A | 7/2004 |
| JP | 2012-074536 A | 4/2012 |
| KR | 10-2010-0038232 A | 4/2010 |
| KR | 10-2010-0105506 A | 9/2010 |
| WO | 2005/024946 A1 * | 3/2005 |
| WO | 2006/101155 A1 | 9/2006 |
| WO | 2013/003257 A2 | 1/2013 |
| WO | 2013/003695 A2 | 1/2013 |
| WO | 2013/003257 A3 | 3/2013 |
| WO | 2013/003695 A3 | 5/2013 |
| WO | 2013/172814 A1 | 11/2013 |
| WO | 2013/184145 A1 | 12/2013 |

OTHER PUBLICATIONS

Notice of Allowance received for Chinese Patent Application No. 201280032156.7, mailed on Jul. 25, 2016, 4 Pages of Notice of Allowance including 2 Pages of English Translation.

Office Action received for Chinese Patent Application No. 201280032156.7, mailed on May 19, 2016, 3 Pages.

Notice of Allowance Received for Japanese Patent Application No. 2014-517243, mailed on Dec. 1, 2015, 3 Pages.

Office Action received for German Patent Application No. 112012002654.3, mailed on Sep. 6, 2016, 12 pages of German Office Action Only.

Office Action received for Taiwan Patent Application No. 102115911, mailed on Feb. 26, 2015, 8 pages of English Translation and 10 pages of Taiwan Office Action.

Office Action received for United Kingdom Patent Application No. 1321492.9, mailed on Jul. 27, 2015, 2 pages.

International Preliminary Report on Patentability and Written Opinion received for PCT Patent Application No. PCT/US2012/041714, mailed on Dec. 18, 2014, 7 pages.

International Preliminary Report on Patentability and Written Opinion received for PCT Patent Application No. PCT/US2012/044871, mailed on Jan. 16, 2014, 7 pages.

Office Action received for United Kingdom Patent Application No. 1321492.9, mailed on Feb. 17, 2015, 3 pages.

Office Action received for Japanese Patent Application No. 2014-517243, mailed on Mar. 3, 2015, 5 pages of English Translation and 5 pages of Japanese Office Action.

Office Action received for Taiwan Patent Application No. 101119764, mailed on Dec. 20, 2012, 2 pages of Office Action only.

Office Action received for Taiwan Patent Application No. 101119764, mailed on Mar. 24, 2014, 9 pages of English Translation and 6 pages of Taiwan Office Action.

Ma, Qing, "Direct BUiLD-Up Layer on an Encapsulated Die Package", U.S. Appl. No. 09/640,961, filed Aug. 16, 2000, 70 pages.

International Preliminary Report on Patentability and Written Opinion received for PCT Patent Application No. PCT/US2012/037787, mailed on Nov. 27, 2014, 8 pages.

International Search Report and Written Opinion received for PCT Patent Application No. PCT/US2012/037787, mailed on Jul. 26, 2013, 11 pages.

International Search Report and Written Opinion received for PCT Patent Application No. PCT/US2012/041714, mailed on Feb. 26, 2013, 10 pages.

International Preliminary Report on Patentability and Written Opinion received for PCT Patent Application No. PCT/US2012/043945, mailed on Jan. 16, 2014, 9 pages.

International Search Report and Written Opinion received for PCT Patent Application No. PCT/US2012/043945, mailed on Jan. 10, 2013, 12 pages.

International Search Report and Written Opinion received for PCT Patent Application No. PCT/US2012/044871, mailed on Jan. 10, 2013, 10 pages.

* cited by examiner

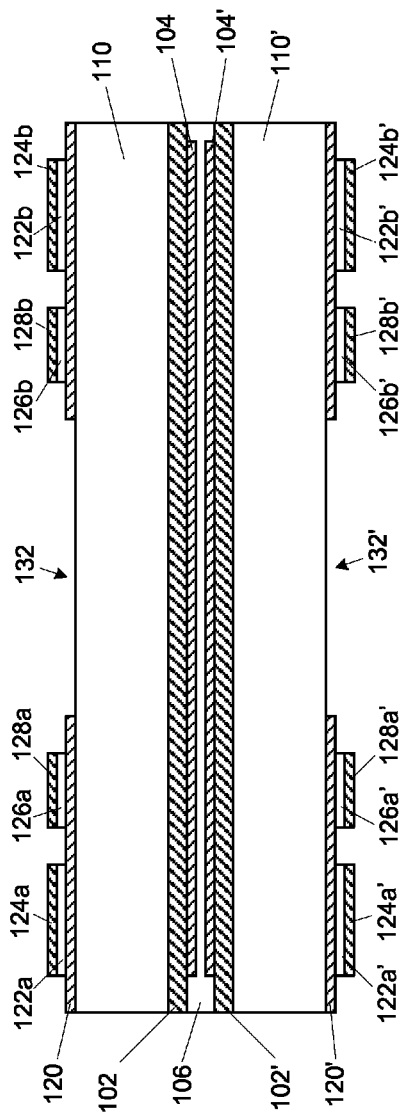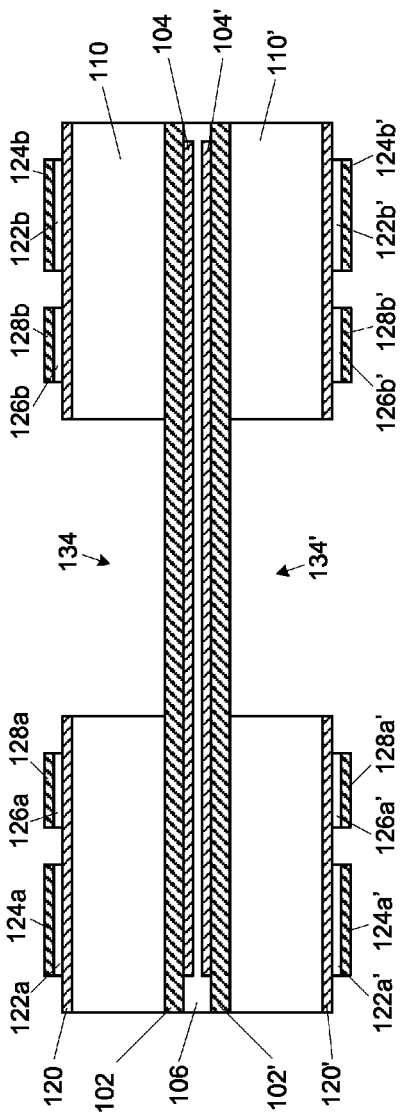

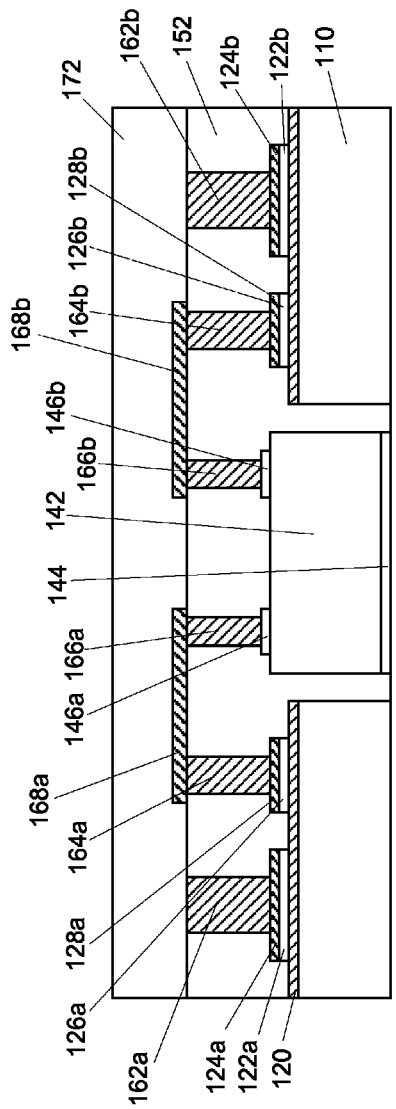
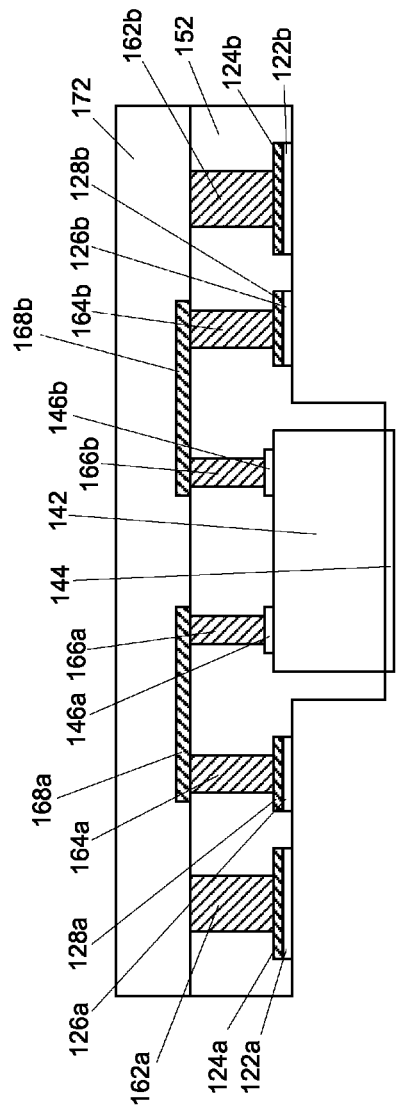

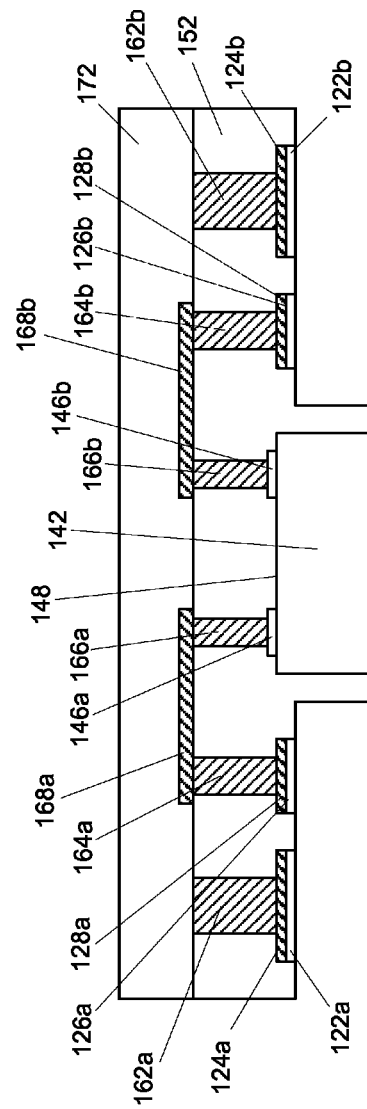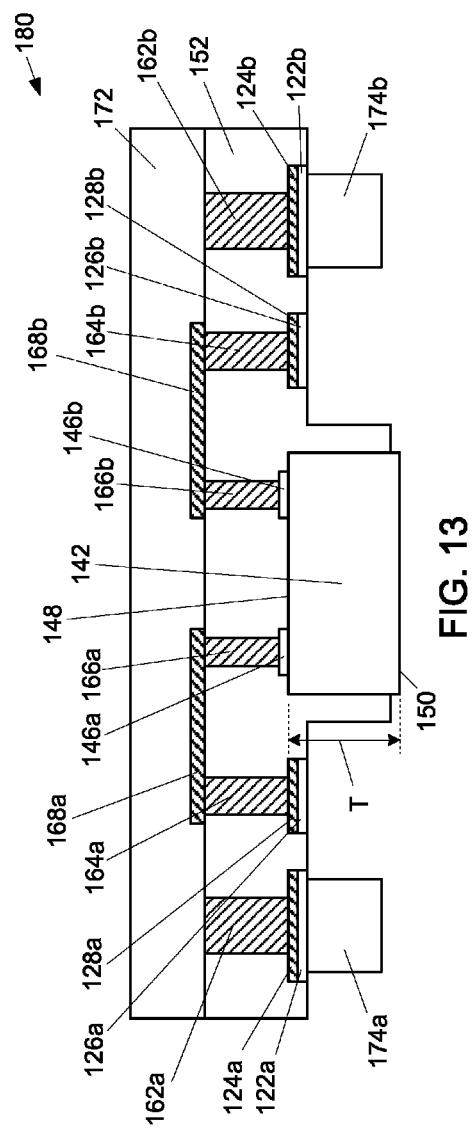

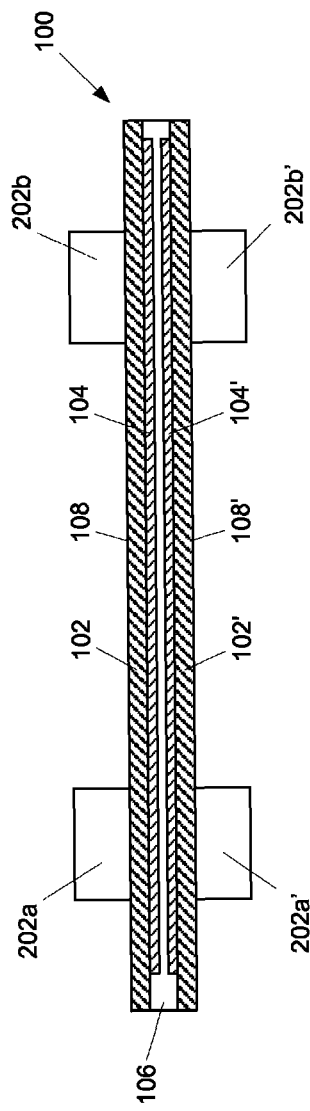
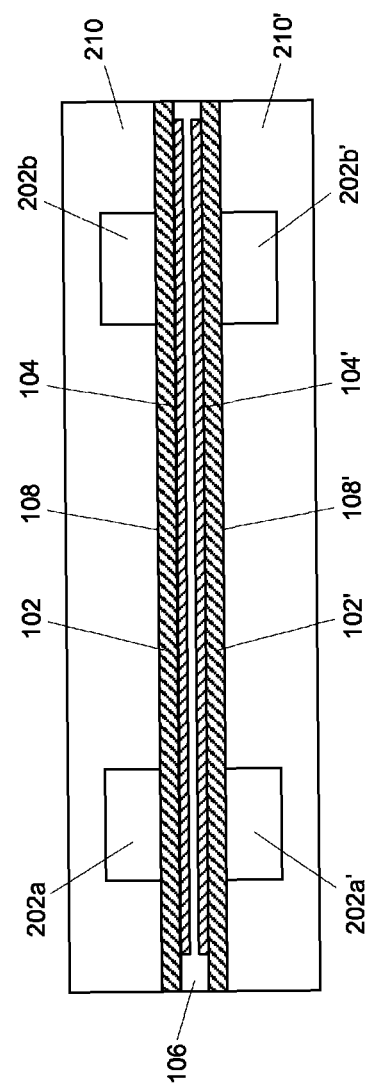
FIG. 14
FIG. 15

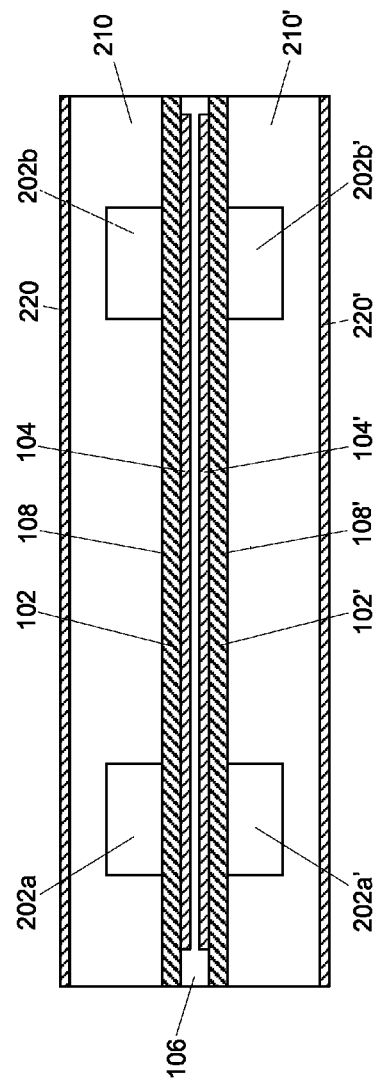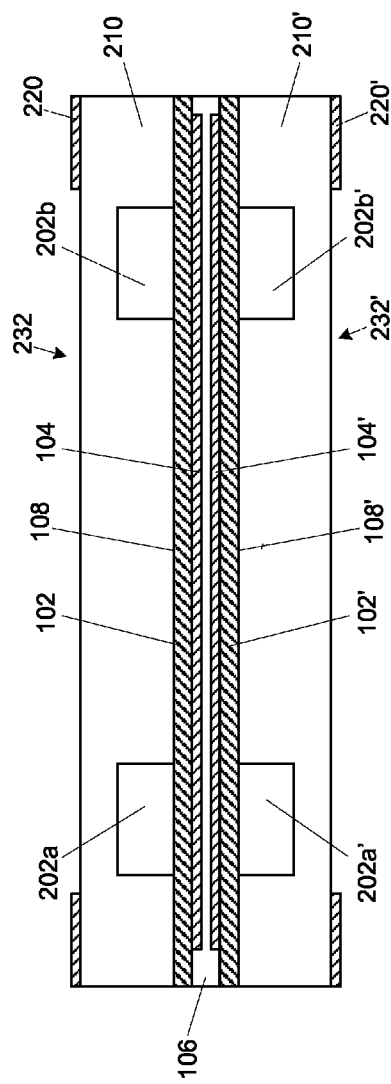

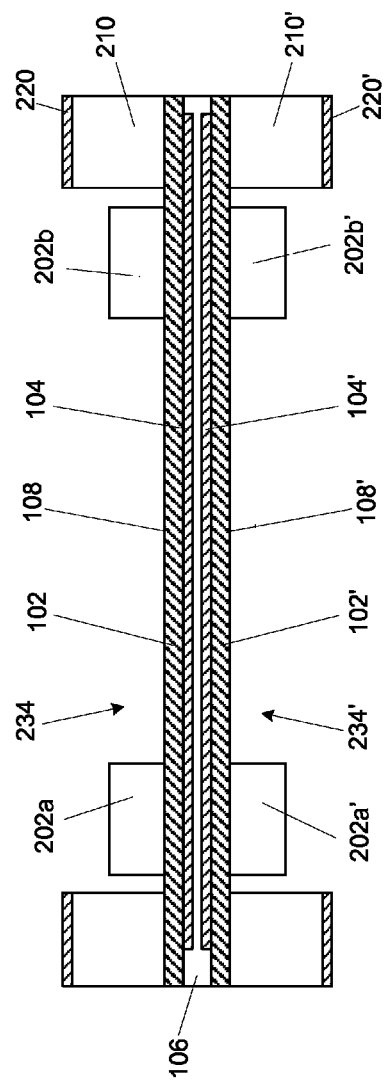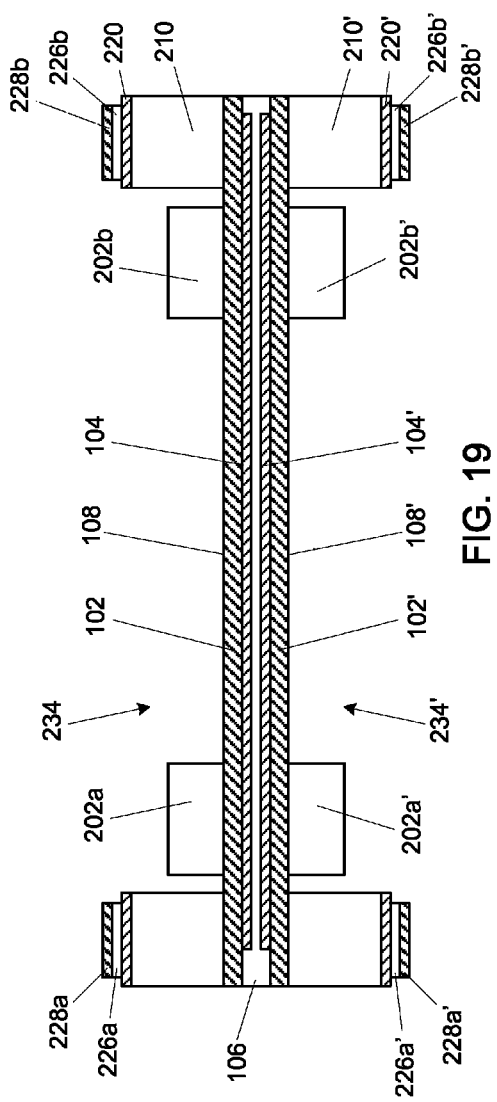

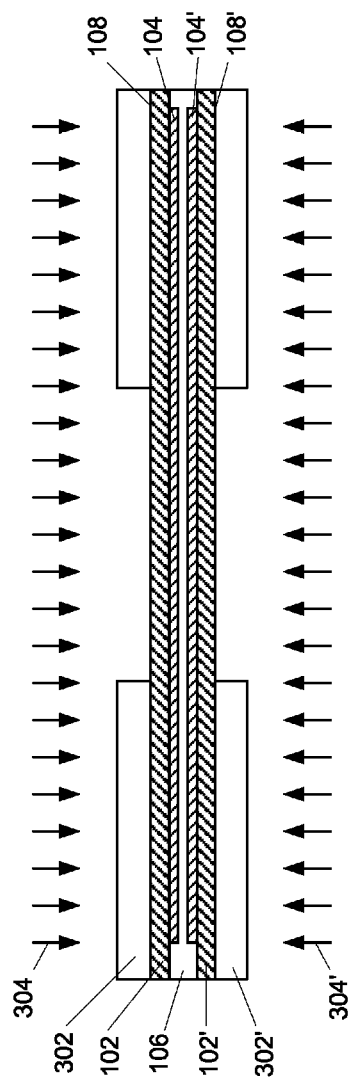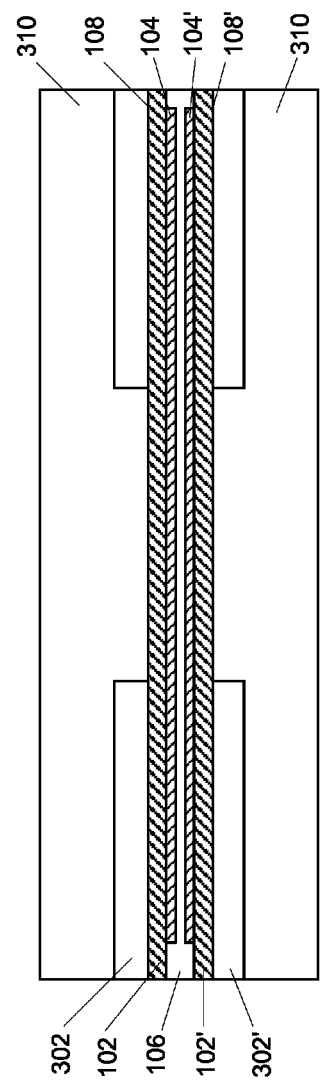

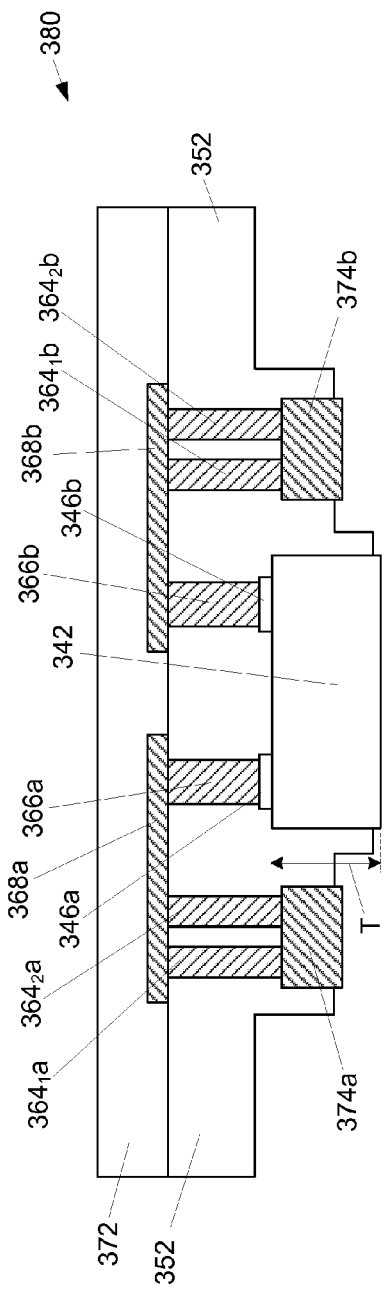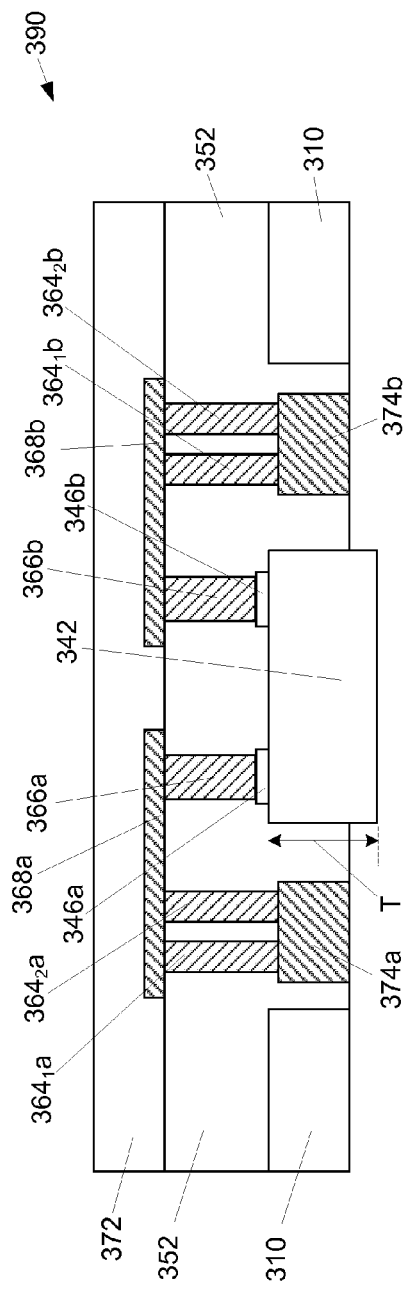

METHOD OF FORMING A MICROELECTRONIC DEVICE PACKAGE

RELATED APPLICATION

The present application is a divisional of U.S. patent application Ser. No. 13/169,162, filed on Jun. 27, 2011, entitled "SECONDARY DEVICE INTEGRATION INTO CORELESS MICROELECTRONIC DEVICE PACKAGES".

BACKGROUND

Embodiments of the present description relate generally to the field of microelectronic device package designs and, more particularly, to microelectronic device packages having bumpless build-up layer (BBUL) designs.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

FIGS. 1-13 illustrate side cross-sectional views of a process of forming a bumpless build-up layer coreless (BBUL-C) microelectronic package with surface mounted device-side secondary devices, according to one embodiment of the present description.

FIGS. 14-25 illustrate side cross-sectional views of a process of forming a bumpless build-up layer coreless (BBUL-C) microelectronic package with embedded device-side secondary devices, according to another embodiment of the present description.

FIGS. 26-37 illustrate side cross-sectional views of a process of forming a bumpless build-up layer coreless (BBUL-C) microelectronic package with embedded device-side secondary devices, according to still another embodiment of the present description.

DETAILED DESCRIPTION

Figure 1:
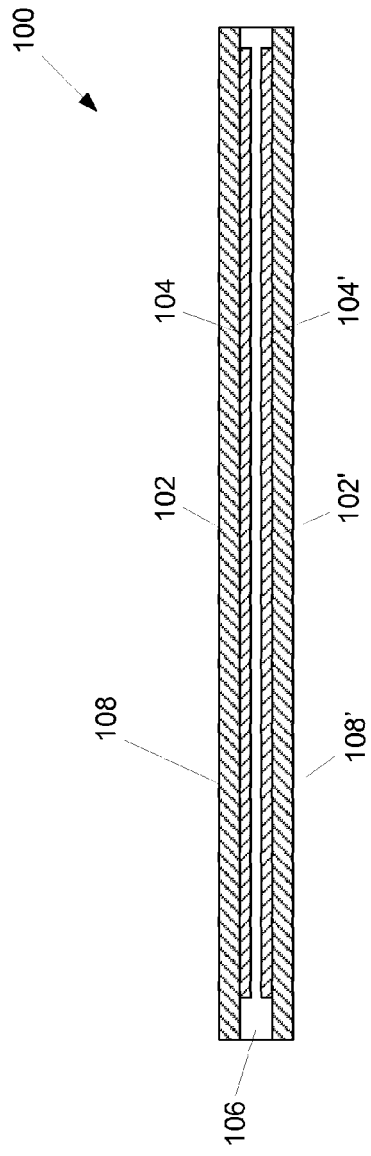

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of fabricating microelectronic device packages and, more particularly, to microelectronic device packages having bumpless build-up layer (BBUL) designs, wherein at least one secondary device, such as a capacitor, a micro electromechanical device (such as an accelerometer, radio frequency switches, and the like), a GPS device, a passive device, and the like, is disposed within the thickness (i.e. the z-direction or z-height) of the microelectronic device of the microelectronic device package. In some embodiments of the present description, openings or cavity structures may be created using relatively thick dielectric materials, such as photo definable photoresist materials, wherein microelectronic devices and components may be mounted therein. Such a use of relatively thick dielectric material cavities may enable packaging architectures that can allow surface mounting or embedding a variety of device side secondary devices without sacrificing z-height (i.e. thickness) constraints. In addition, embodiments of the present description may allow for microelectronic device back surfaces being above the device side secondary devices, such that heat sinks may directly contact the microelectronic device back surfaces, or such that additional devices (e.g. memory, logic, etc) may be attached with through silicon vias to the microelectronic device back surfaces.

FIGS. 1-13 illustrate cross-sectional views of an embodiment of a process of forming a bumpless build-up layer coreless (BBUL-C) microelectronic package with surface mounted device-side secondary devices. As shown in FIG. 1, a carrier 100 may be provided. The carrier 100 illustrated may be a copper laminated substrate comprising an adhesion material 106 disposed between two opposing copper release layers (i.e. a first copper release layer 104 and a second copper release layer 104') with a two opposing copper layers (i.e. a first copper layer 102 and a second copper layer 102') abutting their respective copper release layers (i.e. the first copper release layer 104 and the second copper release layer 104') and abutting a portion of the adhesion material 106, wherein the exterior surface of the first copper layer 102 defines a first surface 108 of the carrier 100 and the exterior surface of the second copper layer 102' defines a second surface 108' of the carrier 100. The adhesion material 106 may be any appropriate material, including but not limited to an epoxy material. It is understood that although the layers laminated with the adhesion material 106 are specifically identified as copper layers (i.e. the copper layers and the copper release layers), the present description is not so limited, as the layers may be made of any appropriate material.

Figure 2:
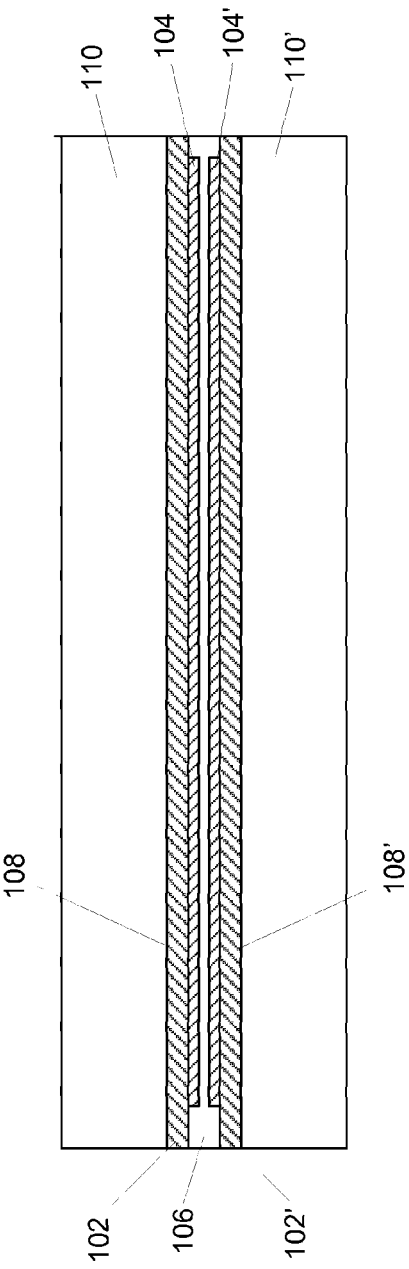
Figure 3:
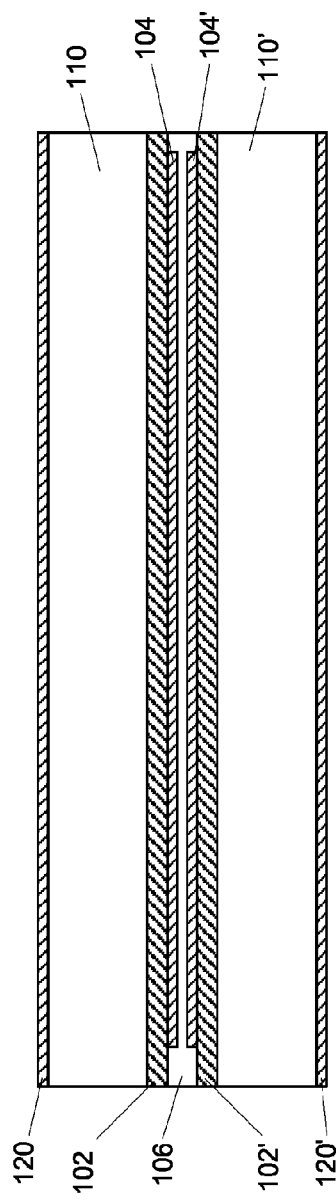

As shown in FIG. 2, a first sacrificial material layer 110, such as a photoresist material, may be formed on the carrier first surface 108 and a second sacrificial material layer 110', such as a photoresist material, may be formed on the carrier second surface 108'. A first protective layer 120, such as a metal foil (for example, copper foil), may be formed on the first sacrificial material layer 110, and a second protective layer 120', such as a metal foil (for example, copper foil), may be formed on the second sacrificial material layer 110', as shown in FIG. 3. The first sacrificial material layer 110 and the second sacrificial material layer 110' may be formed by any technique known in the art, including but not limited to spin coating, dry photofilm lamination, and chemical vapor deposition. The first protective layer 120 and the second protective layer 120' may be formed by any technique known in the art, including but not limited to deposition and foil lamination. In one embodiment, the first and second sacrificial material layer 110 and the second sacrificial material layer 110' may be deposited to thickness of between about 300 μm and 600 μm.

Figure 4:
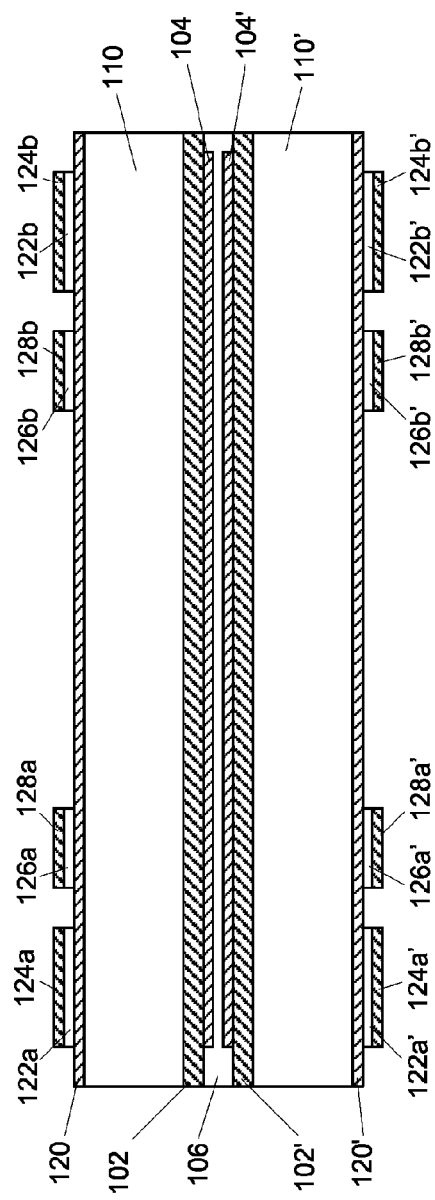

As shown in FIG. 4, secondary device pads may be formed on the protective layers. As illustrated, a first secondary device pad 124a and a second secondary device pad 124b may be formed on the first protective layer 120, and a third secondary device pad 124a' and a fourth secondary device pad 124b' may be formed on the second protective layer 120'. Metallization layers (i.e. elements 122a, 122b, 122a', and 122b') may be disposed between their respective protective layers (i.e. elements 120 and 120') and their respective secondary device pads (e.g. elements 124a, 124b, 124a', and 124b'). The metallization layers (i.e. elements 122a, 122b, 122a', and 122b') will be subsequently discussed in further detail. As also shown in FIG. 4, package-on-package (PoP) pads may also be formed on the protective layers (e.g. elements 120 and 120') simultaneously with the formation of the secondary device pads (e.g. elements 124a, 124b, 124a', and 124b'), as will be understood to those skilled in the art. FIG. 4 illustrates a first package-on-package pad 128a and a second package-on-package pad 128b may also be formed on the first protective layer 120, and a third package-on-package pad 128a' and a fourth package-on-package pad 128b' may be formed on the second protective layer 120'. Metallization layers (i.e. elements 126a, 126b, 126a', and 126b' may also be disposed between their respective protective layers (e.g. elements 120 and 120') and their respective package-on-package pad (e.g. elements 128a, 128b, 128a', and 128b'). As will be understood those skilled in the art, the package-on-package pads may be used to form connections between microelectronic device packages in the z-direction for stacking (e.g. referred to as 3D stacking), without the need for through silicon vias. The secondary device pads and the package-on-package pads may be formed by any technique known in the art, including deposition, photolithography, and etching.

As shown in FIG. 5, an opening 132 may be formed through the first protective layer 120 to expose a portion of the first sacrificial material layer 110, and an opening 132' may be formed simultaneously in second protective layer 120' to expose a portion of the second sacrificial material layer 110'. The first protective layer opening 132 and the second protective layer opening 132' may be formed by any technique known in the art, including but not limited to photolithographic patterning and etching. It is understood that the first sacrificial material layer 110 and the second sacrificial material layer 110' may act as an etch stop during the formation of the first protective layer opening 132 and the second protective layer opening 132'.

As shown in FIG. 6, an opening 134 may be formed, using the first protective layer 120 as a mask, through the first sacrificial material layer 110 to expose a portion of the carrier first surface 108. An opening 134' may be formed simultaneously, using the second protective layer as a mask, through the second sacrificial material layer 110' to expose a portion of the carrier second surface 108'. The first sacrificial material layer opening 134 and the second sacrificial material layer opening 134' may be formed by any technique known in the art, including but not limited to photolithographic processes and wet or dry etching, wherein the first copper layer 102 and the second copper layer 102' may act as etch stops.

Figure 7:
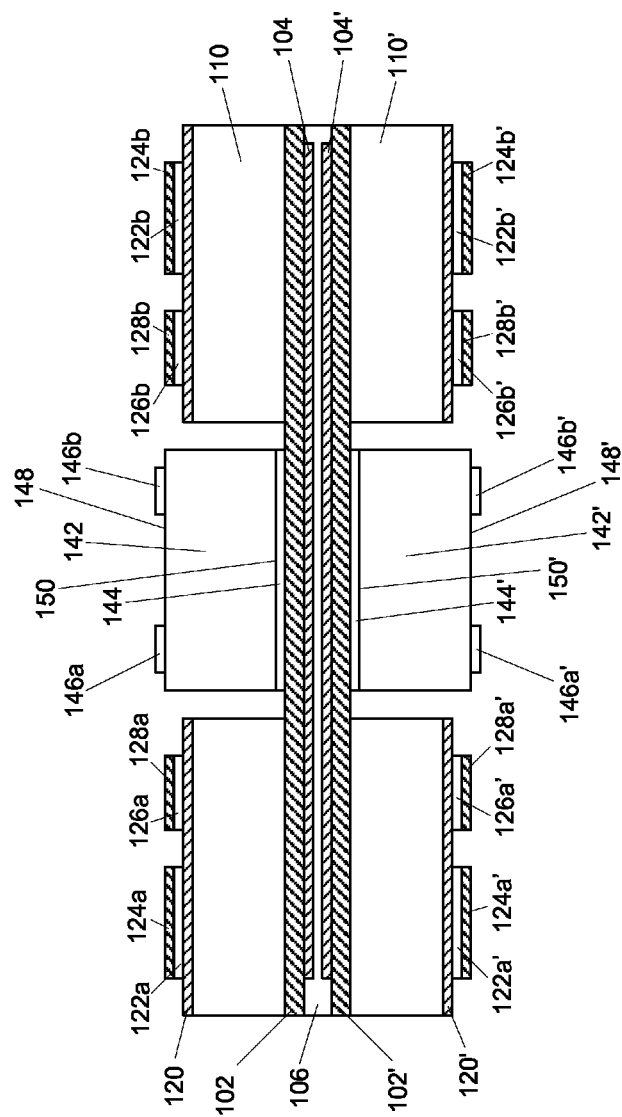

As shown in FIG. 7, a first microelectronic device 142 may be attached by a back surface 150 thereof with an adhesive material 144 to the carrier first surface 108 within the first sacrificial material layer opening 134. The first microelectronic device 142 may have at least one contact land (shown as elements 146a and 146b) on an active surface 148 thereof. A second microelectronic device 142' may be attached by a back surface 150' with an adhesive material 144' to the carrier second surface 108' within the second sacrificial material layer opening 134'. The second microelectronic device 142' may have at least one contact land (shown as elements 146a' and 146b') on an active surface 148' thereof. The first microelectronic device 142 and the second microelectronic device 142' may be any desired device, including but not limited to a microprocessor (single or multi-core), a memory device, a chipset, a graphics device, an application specific integrated circuit, or the like. The adhesive material 144 and 144' may be any appropriate material, including but not limited to a die backside film.

Figure 8:
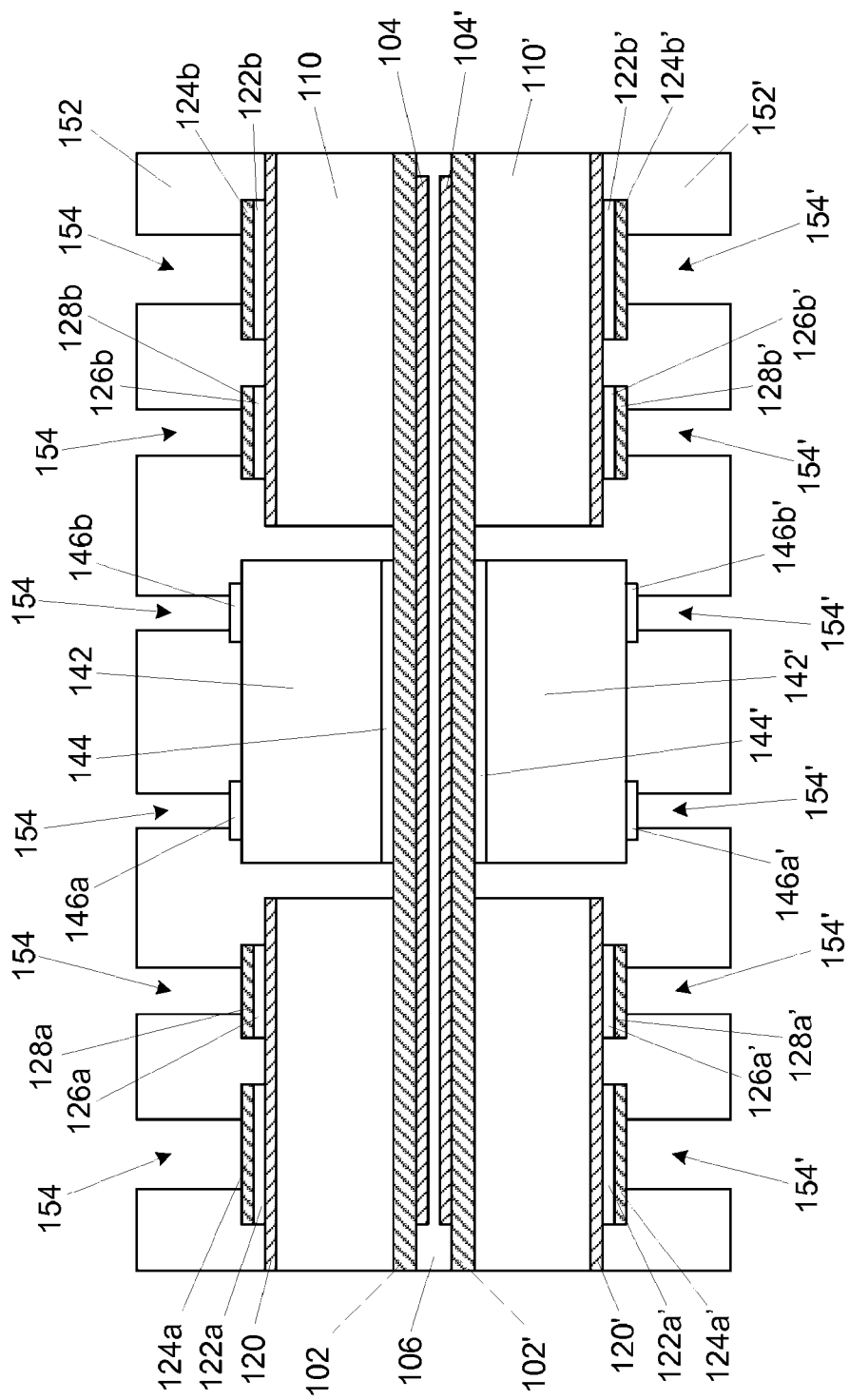

As shown in FIG. 8, a first dielectric layer 152 may be formed on the first microelectronic device 142, the first protective layer 120, the first package-on-package pads 128a, the second package-on-package 128b, the first secondary device pad 124a, and the second secondary device pad 124b. A second dielectric layer 152' may be simultaneously formed on the second microelectronic device 142', the second protective layer 120', the third package-on-package pad 128a', the fourth package-on-package pad 128b', the third secondary device pad 124a', and the fourth secondary device pad 124b'. As also shown in FIG. 8, a plurality of openings 154 may be formed in the first dielectric layer 152 to expose at least a portion of each opening's 154 respective the first microelectronic device contact lands 146a and 146b, the first package-on-package pads 128a, the second package-on-package pads 128b, the first secondary device pads 124a, and the second secondary device pads 124b. A plurality of openings 154' may also be simultaneously formed in the second dielectric layer 152' to expose at least a portion of each opening's 154' respective the second microelectronic device contact lands 146a' and 146b', the third package-on-package pads 128a', the fourth package-on-package pads 128b', the third secondary device pads 124a', and the fourth secondary device pads 124b'. In one embodiment, the first dielectric layer 152 and the second dielectric layer 152' may comprise silica-filled epoxy, such as build-up films available from Ajinomoto Fine-Techno Co., Inc., 1-2 Suzuki-cho, Kawasaki-ku, Kawasaki-shi, 210-0801, Japan (e.g. Ajinomoto ABF-GX13, Ajinomoto GX92, and the like). The openings 154 and 154' may be formed by any technique known in the art including but not limited to laser or ion drilling, etching, and the like.

Figure 9:
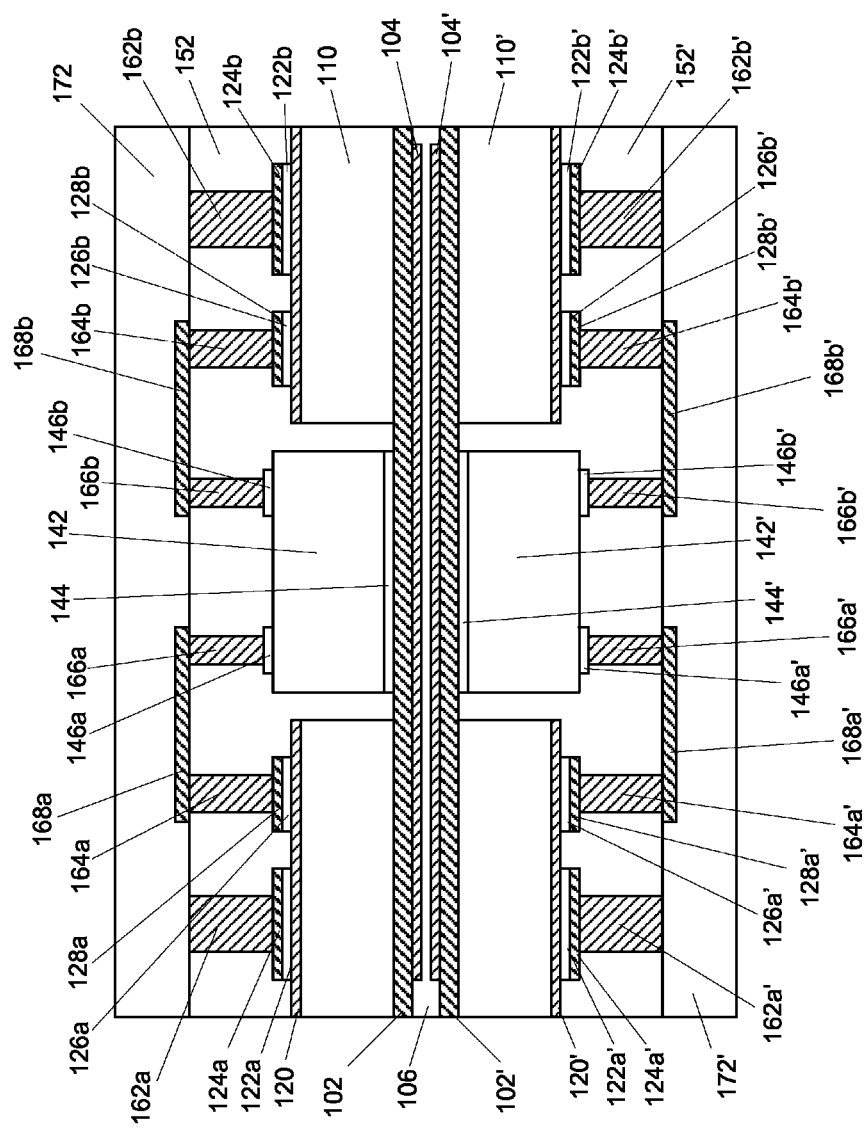

As shown in FIG. 9, a conductive material, such as copper, aluminum, silver, gold, and alloys thereof, may be disposed within the openings 154, by any technique known in the art, to form a first microelectronic device contact land first conductive via 166a, a first microelectronic device contact land second conductive via 166b, a first package-on-package pad conductive via 162a, a second package-on-package pad conductive via 162b, a first secondary device pad conductive via 164a, and a second secondary device pad conductive via 164b. The conductive material may also be simultaneously disposed within the openings 154' to form a second microelectronic device contact land first conductive via 166a', a second microelectronic device contact land second conductive via 166b', a third package-on-package pad conductive via 162a', a fourth package-on-package pad conductive via 162b', a third secondary device pad conductive via 164a', and a fourth secondary device pad conductive via 164b'. As further shown in FIG. 9, conductive traces may be formed to electrically connect various conductive vias. As illustrated, a first conductive trace 168a may be formed to electrically connect the first secondary device pad conductive via 164a and the first microelectronic device contact land first conductive via 166a and a second conductive trace 168b may be formed to electrically connect the second secondary device pad conductive via 164b and the first microelectronic device contact land second conductive via 166b. Further, a third conductive trace 168a' may be formed to electrically connect the third secondary device pad conductive via 164a' and the second microelectronic device contact land first conductive via 166a' and a fourth conductive trace 168b' may be formed to electrically connect the fourth secondary device pad conductive via 164b' and the second microelectronic device contact land second conductive via 166b'. Thus, the connection of the various conductive vias and conductive traces form electrically conductive paths between the secondary devices pads and the microelectronic device. The conductive traces (e.g. elements 168a, 168b, 168a', and 168b') may be any appropriate conductive material, including but not limited to copper, aluminum, silver, gold, and alloys thereof.

It is understood that the additional dielectric layer, conductive vias, and conductive traces may be built up to form a desired number of layers. Once a desired number of layers are formed, exterior layers, such as a glass cloth layers, may be formed. As shown in FIG. 9, a first exterior layer 172 may be formed on the first dielectric layer 152 and a second exterior layer 172' may be formed on the second dielectric layer 152'. The exterior layers (i.e. first exterior layer 172 and second exterior layer 172') may be used to engineer inherent warpages/stresses in microelectronic packages, as will be understood to those skilled in the art.

The structures thus formed on the carrier first surface 108 and on the carrier second surface 108' may be separated from one another with a depaneling process, as known in the art. FIG. 10 illustrates the structure formed on the carrier first surface 108 after depaneling. As shown in the FIG. 11, the first sacrificial material layer 110 may be removed, such as by plasma ashing or solvent release, as will be understood to those skilled in the art. The protective layer 120 may also be removed by any appropriate technique known in the art, as also shown in FIG. 11. The adhesive layer 144 may be removed from the first microelectronic device 142, such as by plasma ashing or a dissolution chemical, as shown in FIG. 12, to form a microelectronic device package 180. It is understood that if plasma ashing is used to remove the first sacrificial material layer 110, the adhesive layer 144 may also be removed in a single plasma ashing step.

At least one secondary device may then be attached to a secondary device pad. As shown in FIG. 13, a first secondary device 174a may be attached to the first secondary device pad 124a with the metallization layer 122a, and a second secondary device 174b may be attached to the second secondary device pad 124b with the metallization layer 122b. As can be seen in FIG. 13, the process of FIGS. 1-13 may result in a secondary device (e.g. elements 174a and 174b) which is disposed within a thickness T of the first microelectronic device 142 (i.e. between the first microelectronic device active surface 148 and the first microelectronic device back surface 150).

FIGS. 14-25 illustrate cross-sectional views of another embodiment of a process of forming a bumpless build-up layer coreless (BBUL-C) microelectronic package with embedded device side secondary devices. As shown in FIG. 14, a carrier, such as the carrier 100 of FIG. 1, may be provided, and at least one stand-off may be formed on the carrier. As illustrated, a first stand-off 202a and a second stand-off 202b may be formed on the carrier first surface 108, and a third stand-off 202a', and a fourth stand-off 202b' may be formed on the carrier second surface 108'. The stand-offs (e.g. elements 202a, 202b, 202a', and 202b') may be formed of any appropriate material, including but not limited to copper.

As shown in FIG. 15, a first sacrificial material layer 210, such as a photoresist material, may be formed on the carrier first surface 108 and over the first stand-off 202a and second stand-off 202b, and a second sacrificial material layer 210', such as a photoresist material, may be formed on the carrier second surface 108' and over the third stand-off 202a' and the fourth stand-off 202b'. A first protective layer 220 may be formed on the first sacrificial material layer 210, and a second protective layer 220', such as a metal foil may be formed on the second sacrificial material layer 210', as shown in FIG. 16. The first sacrificial material layer 210 and the second sacrificial material layer 210' may be formed by any technique known in the art, including but not limited to spin coating, dry photofilm lamination, and chemical vapor deposition. The first protective layer 220 and the second protective layer 220' may be formed by any technique known in the art, including but not limited to deposition and foil lamination. In one embodiment, the first sacrificial material layer 210 and the second sacrificial material layer 210' may be deposited to thickness of between about 300 μm and 600 μm.

As shown in FIG. 17, an opening 232 may be formed through the first protective layer 220 to expose a portion of the first sacrificial material layer 210, and an opening 232' may be formed simultaneously in second protective layer 220' to expose a portion of the second sacrificial material layer 210'. The first protective layer opening 232 and the second protective layer opening 232' may be formed by any technique known in the art, including but not limited to photolithographic patterning and etching. It is understood that the first sacrificial material layer 210 and the second sacrificial material layer 210' may act as an etch stop during the formation of the first protective layer opening 232 and the second protective layer opening 232'.

As shown in FIG. 18, an opening 234 may be formed, using the first protective layer 220 as a mask, through the first sacrificial material layer 210 to expose the first stand-off 202a, the second stand-off 202b, and a portion of the carrier first surface 108. An opening 234' may be formed simultaneously, using the second protective layer as a mask, through the second sacrificial material layer 210' to expose the third stand-off 202a', the fourth stand-off 202b', and a portion of the carrier second surface 108'. The first sacrificial material layer opening 234 and the second sacrificial material layer opening 234' may be formed by any technique known in the art, including but not limited to photolithography, wherein the first copper layer 102 and the second copper layer 102' may act as etch stops.

As shown in FIG. 19, package-on-package (PoP) pads may be formed on the protective layers (e.g. elements 220 and 220'). FIG. 19 illustrates a first package-on-package pad 228a and a second package-on-package pad 228b formed on the first protective layer 220, and a third package-on-package pad 228a' and a fourth package-on-package pad 228b' formed on the second protective layer 220'. Metallization layers (i.e. elements 226a, 226b, 226a', and 226b' may be disposed between their respective protective layers (e.g. elements 220 and 220') and their respective package-on-package pads (e.g. elements 228a, 228b, 228a', and 228b'). As will be understood those skilled in the art, the package-on-package pads may be used to form connections between microelectronic device packages in the z-direction for stacking (e.g. referred to as 3D stacking), without the need for through silicon vias. The package-on-package pads may be formed by any technique known in the art, including deposition, photolithographic patterning, and etching.

Figure 20:
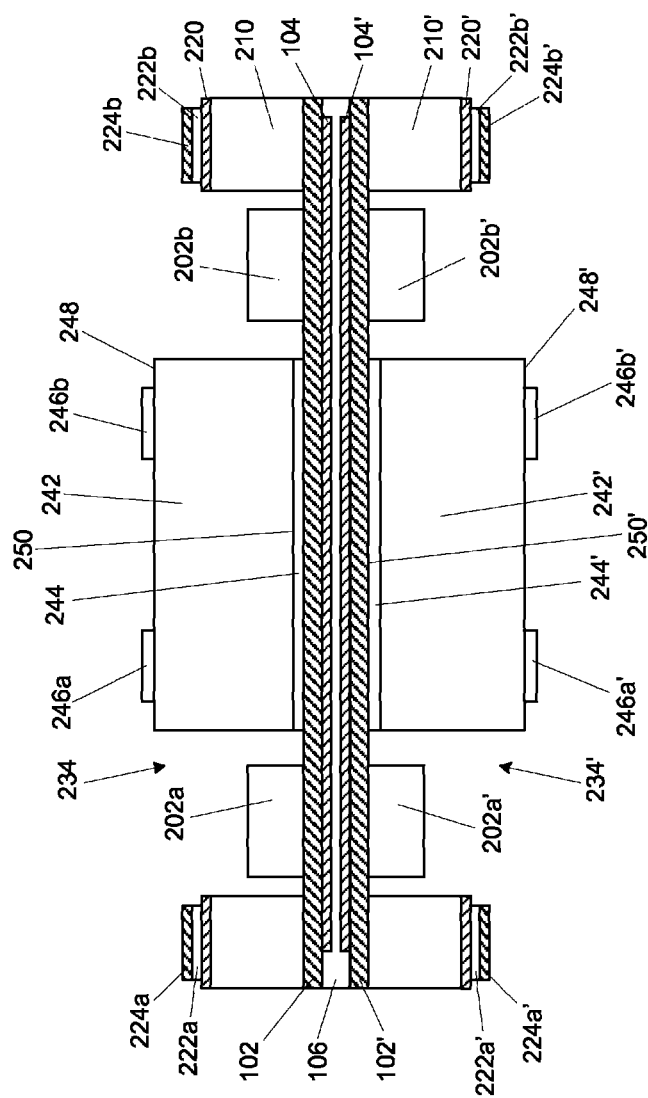

As shown in FIG. 20, a first microelectronic device 242 may be attached by a back surface 250 thereof with an adhesive material 244 to the carrier first surface 108 within the first sacrificial material layer opening 234. The first microelectronic device 242 may have at least one contact land (shown as elements 246a and 246b) on an active surface 248 thereof. A second microelectronic device 242' may be attached by a back surface 250' with an adhesive material 244' to the carrier second surface 108' within the second sacrificial material layer opening 234'. The second microelectronic device 242' may have at least one contact land (shown as elements 246a' and 246b') on an active surface 248' thereof. The first microelectronic device 242 and the second microelectronic device 242' may be any desired device, including but not limited to a microprocessor (single or multi-core), a memory device, a chipset, a graphics device, an application specific integrated circuit, or the like. The adhesive material 244 and 244' may be any appropriate material, including but not limited to a die backside film.

Figure 21:
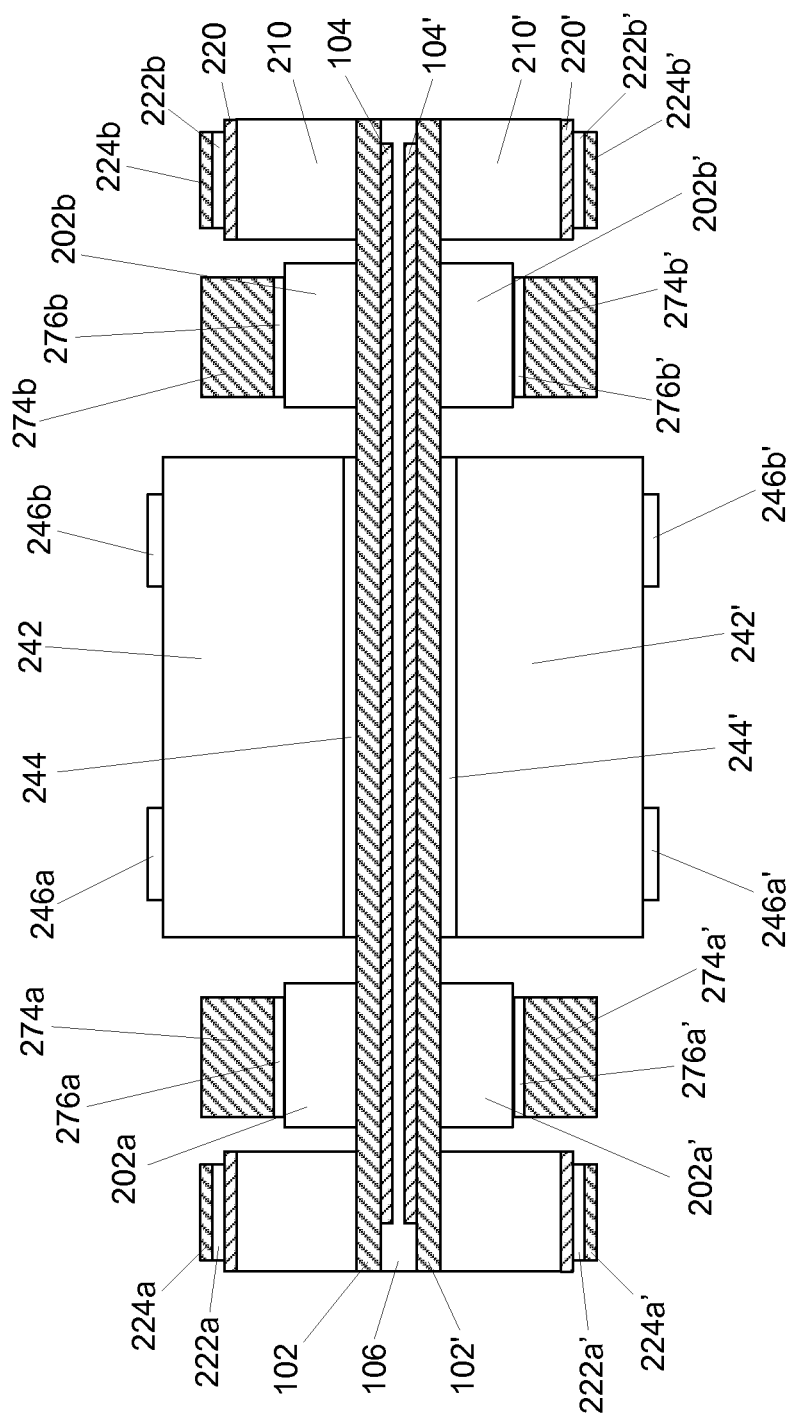

At least one secondary device may then be attached to a respective stand-off. As shown in FIG. 21, a first secondary device 274a may be attached to the first stand-off 202a with an adhesive material 276a, a second secondary device 274b may be attached to the second stand-off 202b with an adhesive material 276b, a third secondary device 274a' may be attached to the third stand-off 202a' with an adhesive material 276a', and a fourth secondary device 274b' may be attached to the fourth stand-off 202b' with an adhesive material 276b'.

Figure 22:
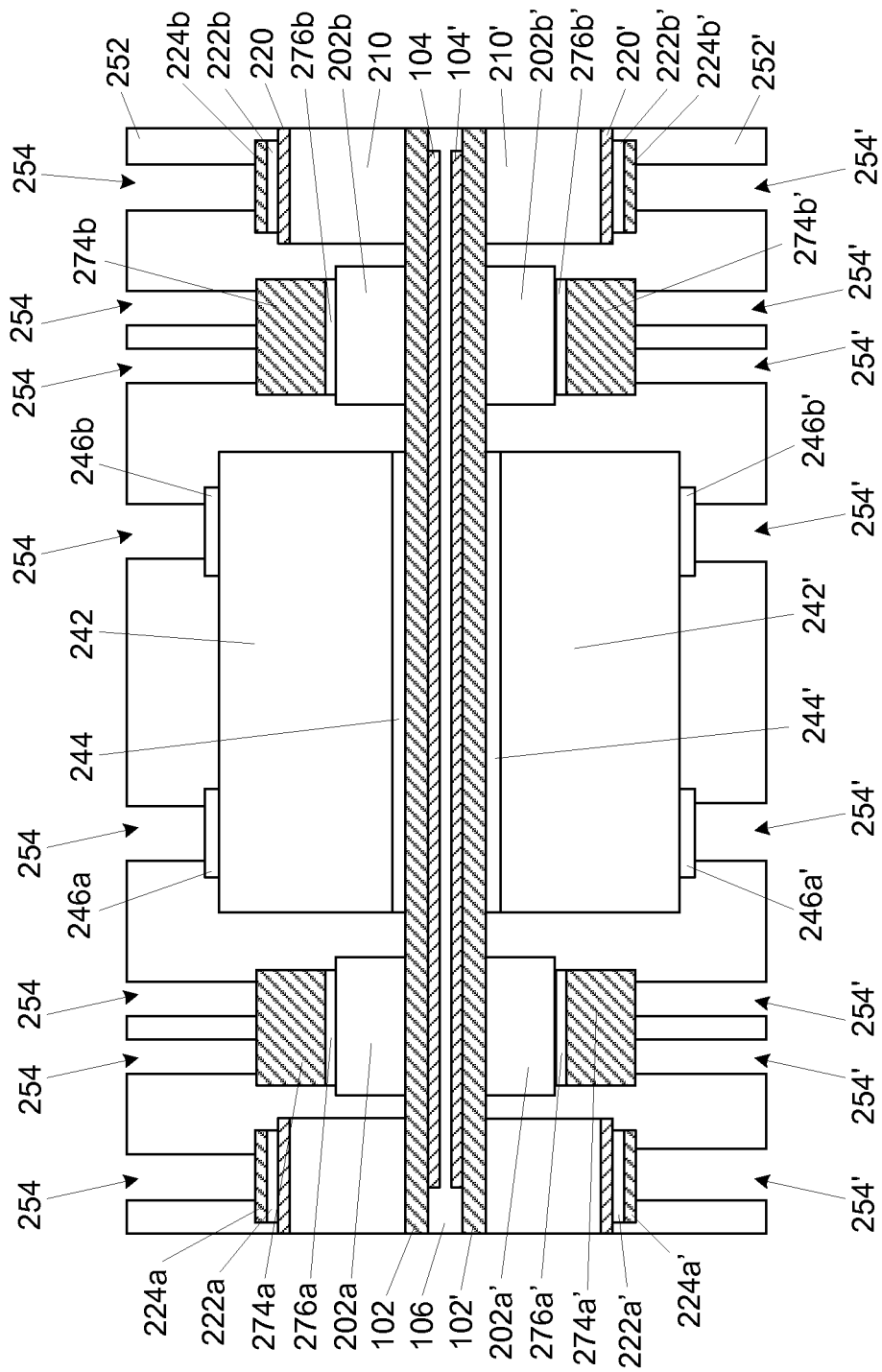

As shown in FIG. 22, a first dielectric layer 252 may be formed on the first microelectronic device 242, the first protective layer 220, the first package-on-package pads 228a, the second package-on-package pads 228b, the first secondary device 274a, and the second secondary device 274b. A second dielectric layer 252' may be simultaneously formed on the second microelectronic device 242', the second protective layer 220', the third package-on-package pad 228a', the fourth package-on-package pad 228b', the third secondary device 274a', and the fourth secondary device 274b'. As also shown in FIG. 22, a plurality of openings 254 may be formed in the first dielectric layer 252 to expose at least a portion of each opening's 254 respective the first microelectronic device contact lands 246a and 246b, the first package-on-package pad 228a, the second package-on-package pad 228b, the first secondary device 274a, and the second secondary device 274b. A plurality of openings 254' may be simultaneously formed in the second dielectric layer 252' to expose at least a portion of each opening's 254' respective the second microelectronic device contact lands 246a' and 246b', the third package-on-package pad 228a', the fourth package-on-package pad 228b', the third secondary device 274a', and the fourth secondary device 274b'. In one embodiment, the first dielectric layer 252 and the second dielectric layer 252' may comprise silica-filled epoxy. The openings 254 and 254' may be formed by any technique known in the art including but not limited to laser drilling, ion drilling, etching, and the like.

Figure 23:
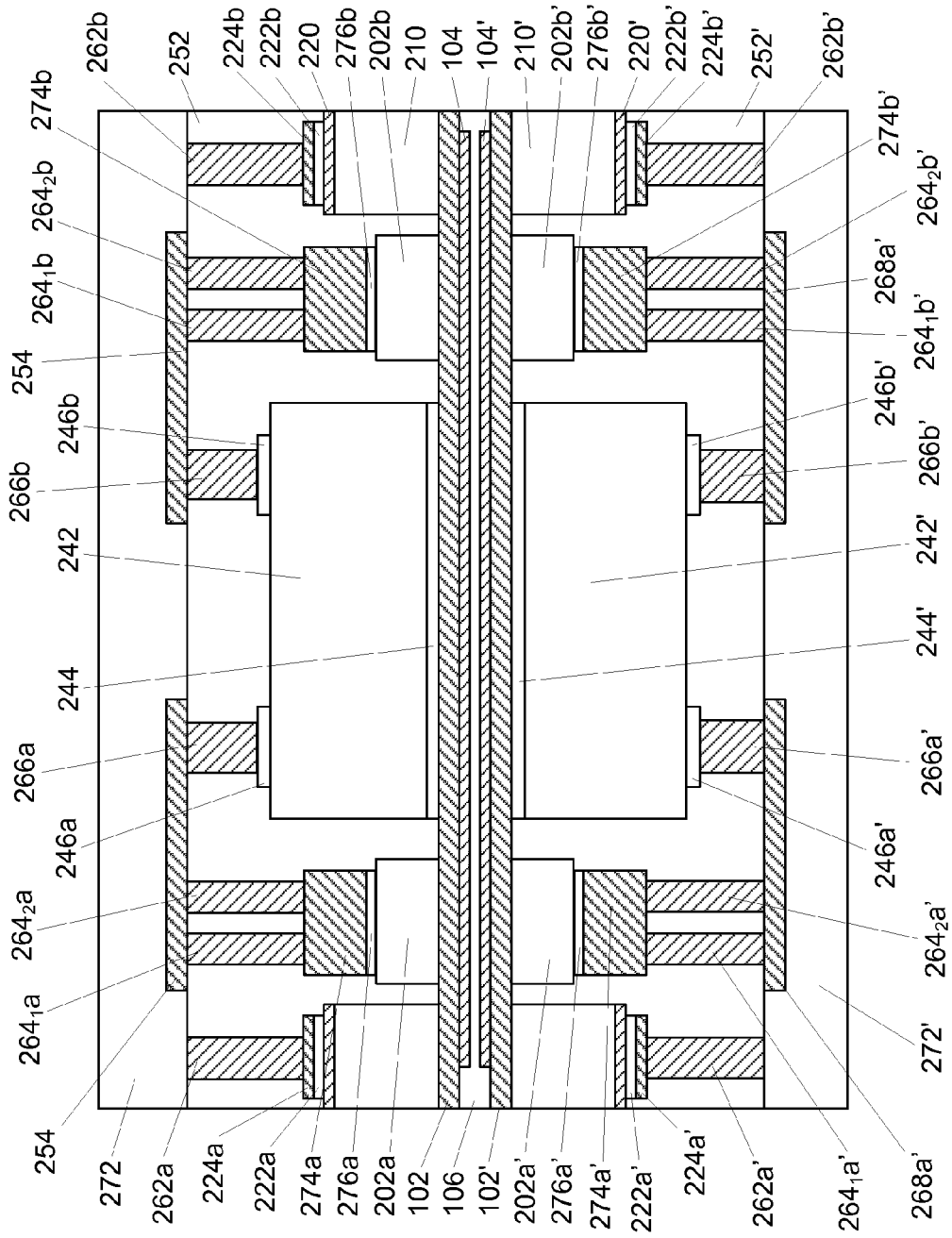

As shown in FIG. 23, a conductive material may be disposed within the first dielectric layer openings 254 (see FIG. 22), by any technique known in the art, to form a first microelectronic device contact land first conductive via 266a, a first microelectronic device contact land second conductive via 266b, a first package-on-package pad conductive via 262a, a second package-on-package pad conductive via 262b, a first secondary device first conductive via $264_1$a, a first secondary device second conductive via $264_2$a, a second secondary device first conductive via $264_1$b, and a second secondary device second conductive via $264_2$b. The conductive material may also be simultaneously disposed within the second dielectric layer openings 254' to form a second microelectronic device contact land first conductive via 266a', a second microelectronic device contact land second conductive via 266b', a third package-on-package pad conductive via 262a', a fourth package-on-package pad conductive via 262b', a third secondary device first conductive via $264_1$a', a third secondary device second conductive via $264_2$a', a fourth secondary device first conductive via $264_1$b', and a fourth secondary device second conductive via $264_2$b'. As further shown in FIG. 23, conductive traces may be formed to electrically connect various conductive vias. As illustrated, a first conductive trace 268a may be formed to electrically connect at least one of the first secondary device first conductive via $264_1$a and the first secondary device second conductive via $264_2$a, and the first microelectronic device contact land first conductive via 266a. A second conductive trace 268b may be formed to electrically connect at least one of the second secondary device first conductive via $264_1$b and the second secondary device second conductive via $264_2$b, and the first microelectronic device contact land second conductive via 266b. Further, a third conductive trace 268a' may be formed to electrically connect at least one of the third secondary device first conductive via $264_1$a' and the third secondary device second conductive via $264_2$a', and the second microelectronic device contact land first conductive via 266a'. A fourth conductive trace 268b' may be formed to electrically connect at least one of the fourth secondary device first conductive via $264_1$b' and the fourth secondary device second conductive via $264_2$1) % and the second microelectronic device contact land second conductive via 266b'. Thus, the connection of the various conductive vias and conductive traces form electrically conductive paths between the secondary devices pads and the microelectronic device. The conductive traces (e.g. elements 268a, 268b, 268a', and 268b') may be any appropriate conductive material.

It is understood that the additional dielectric layer, conductive vias, and conductive traces may be built up to form a desired number of layers. Once a desired number of layers are formed, exterior layers, such as a glass cloth layer, may be formed. As shown in FIG. 23, a first exterior layer 272 may be formed on the first dielectric layer 252 and a second exterior layer 272' may be formed on the second dielectric layer 252'. The exterior layers (i.e. first exterior layer 272 and second exterior layer 272') may be used to engineer inherent warpages/stresses in microelectronic packages, as will be understood to those skilled in the art.

Figure 24:
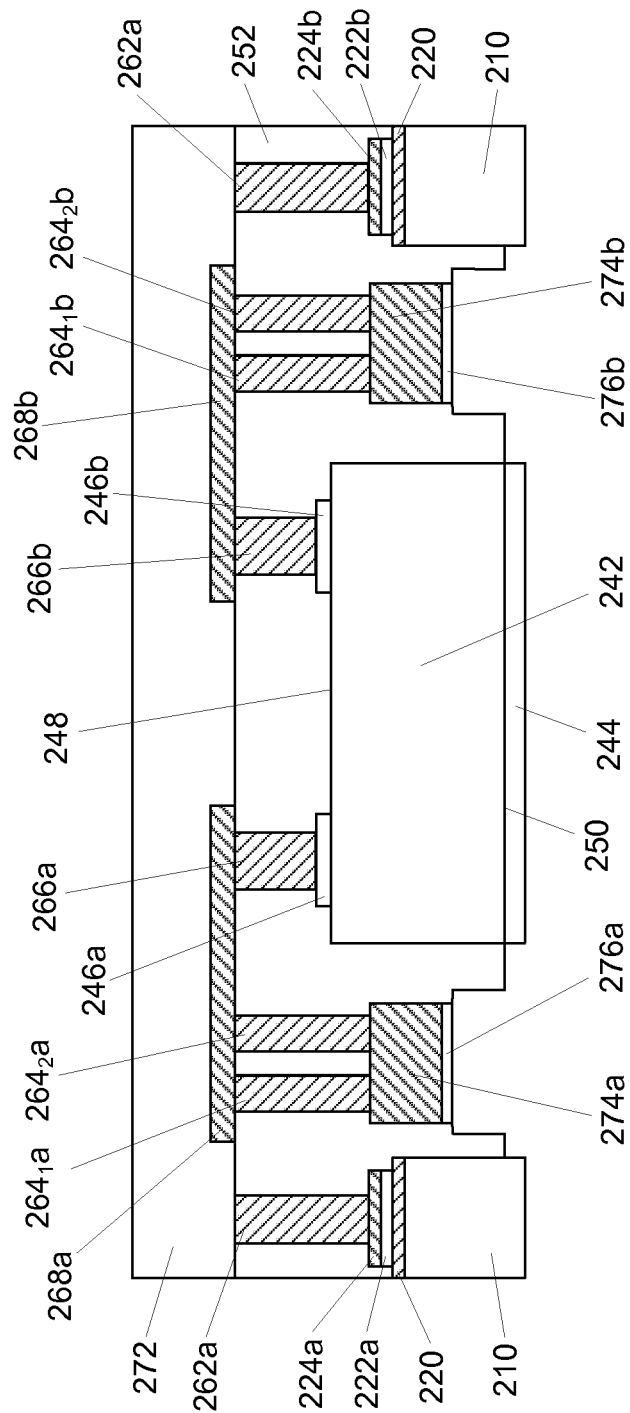
Figure 25:
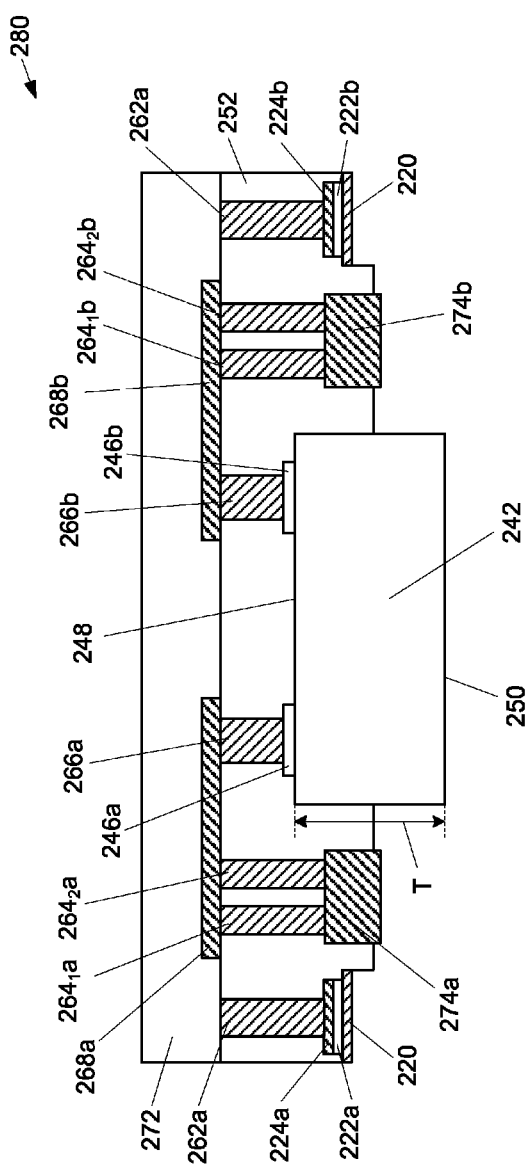

The structures thus formed on the carrier first surface 108 and on the carrier second surface 108' may be separated from one another with a depaneling process. FIG. 24 illustrates the structure formed on the carrier first surface 108 after depaneling, wherein the stand-offs 202a and 202b (see FIG. 23) may be removed by any appropriate technique known in the art. It is understood that if the stand-offs 202a and 202b are copper as is the carrier layers, the stand-offs 202a and 202b may be removed during the depaneling process. As shown in the FIG. 25, the first sacrificial material layer 210 (see FIG. 24) may be removed, such as by plasma ashing or solvent release, as will be understood to those skilled in the art, and the first microelectronic device adhesive layer 244 and the secondary device adhesive layers 276a and 276b may also be removed from the first microelectronic device 242, such as by plasma ashing or a dissolution chemical, as also shown in FIG. 25, to form a microelectronic device package 280. It is understood that if plasma ashing is used to remove the first sacrificial material layer 210, the first microelectronic device adhesive layer 244 may also be removed in a single step.

As can be seen in FIG. 25, the process of FIGS. 14-25 may result in a secondary device (e.g. elements 274a and 274b) which is disposed within a thickness T of the first microelectronic device 242 (i.e. between the first microelectronic device active surface 148 and the first microelectronic device back surface 250).

It is noted that the secondary devices (i.e. elements 274a, 274b, 274a', and 274b' (see FIG. 21)) need not share the same opening (i.e. elements 234, 234' (see FIG. 18)) as the microelectronic devices 244 and 244' (see FIG. 21)). Unique openings can be created for the secondary devices and the microelectronic devices separately to allow optimization, such as minimal build-up layer thickness variability or warpage engineering, as will be understood to those skilled in the art.

Figure 26:
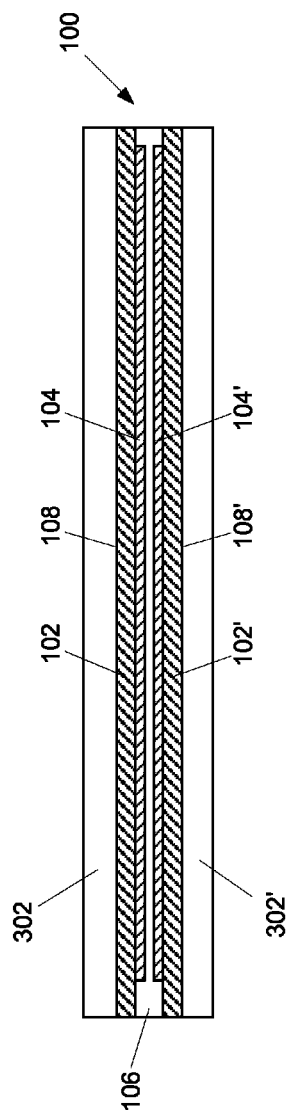

FIGS. 26-38 illustrate cross-sectional views of another embodiment of a process of forming a bumpless build-up layer coreless (BBUL-C) microelectronic package with embedded device-side secondary devices. As shown in FIG. 26, a carrier, such as the carrier 100 of FIG. 1, may be provided, wherein a first stand-off material layer 302 may be deposited over the carrier first surface 108 and a second stand-off material layer 302' may be simultaneously deposited over the carrier second surface 108'. The first stand-off material layer 302 and the second stand-off material layer 302' may be formed of any appropriate material, including but not limited to a photoresist material, and formed by any technique known in the art, including but not limited to spin coating, dry photofilm lamination, and chemical vapor deposition. In one embodiment, the first stand-off material layer 302 and the second stand-off material layer 302' may be deposited to thickness of between about 30 μm and 100 μm.

Figure 27:
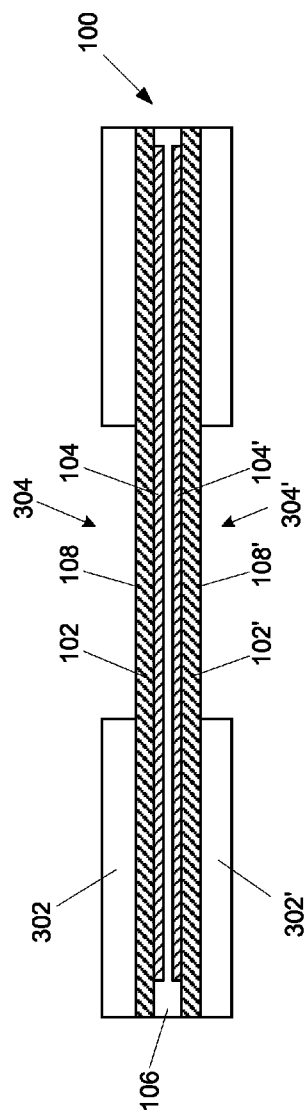

As shown in FIG. 27, an opening 304 may be formed through the first stand-off material layer 302 to expose a portion of the carrier first surface 108, and an opening 304' may be formed simultaneously in second stand-off material layer 302' to expose a portion of the carrier second surface 108'. The first stand-off material layer opening 304 and the second stand-off material layer opening 304' may be formed by any technique known in the art, including but not limited to photolithographic patterning and developing.

As shown in FIG. 28, when a photoresist material is used to form the first stand-off material layer 302 and the second stand-off material layer 302', the photoresist material may be flood exposed (e.g. crosslinked) by exposure to radiation (e.g. light), which is shown as arrows 306 and 306', respectively. As shown in FIG. 29, a first sacrificial material layer 310, such as a photoresist material, may be formed over the first stand-off material layer 302 and in the first stand-off material layer opening 304 (see FIG. 27) and a second sacrificial material layer 310', such as a photoresist material, may be formed over the second stand-off material layer 302' and in the second stand-off material layer opening 304' (see FIG. 27). The first sacrificial material layer 310 and the second sacrificial material layer 310' may be formed by any technique known in the art, including but not limited to spin coating, dry photofilm lamination, and chemical vapor deposition. In one embodiment, the first sacrificial material layer 310 and the second sacrificial material layer 310' may be deposited to thickness of between about 300 μm and 600 μm.

Figure 30:
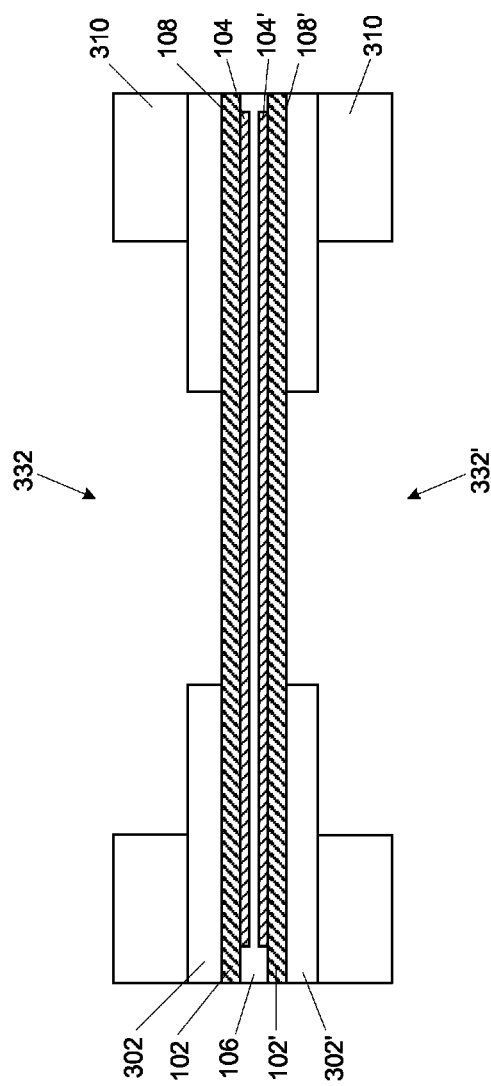

As shown in FIG. 30, an opening 332 may be formed through the first sacrificial material layer 310 to expose a portion of the first stand-off material layer 310 and a portion of the carrier first surface 108, and an opening 332' may be formed simultaneously in the second sacrificial material layer 310' to expose a portion of the second sacrificial material layer 310' and a portion of the carrier second surface 108'. The first sacrificial material layer opening 332 and the second sacrificial material layer opening 332' may be formed by any technique known in the art, including but not limited to photolithographic patterning and developing. It is understood that if photoresist materials are used for the stand-off material layers and the sacrificial material layers, the crosslinking of the first stand-off material layer 302 and second stand-off material layer 302', as shown in FIG. 28, may result in the first stand-off material layer 302 and second stand-off material layer 302' being substantially unaffected during the formation of the first sacrificial material layer opening 332 and the second sacrificial material layer opening 332'.

Figure 31:
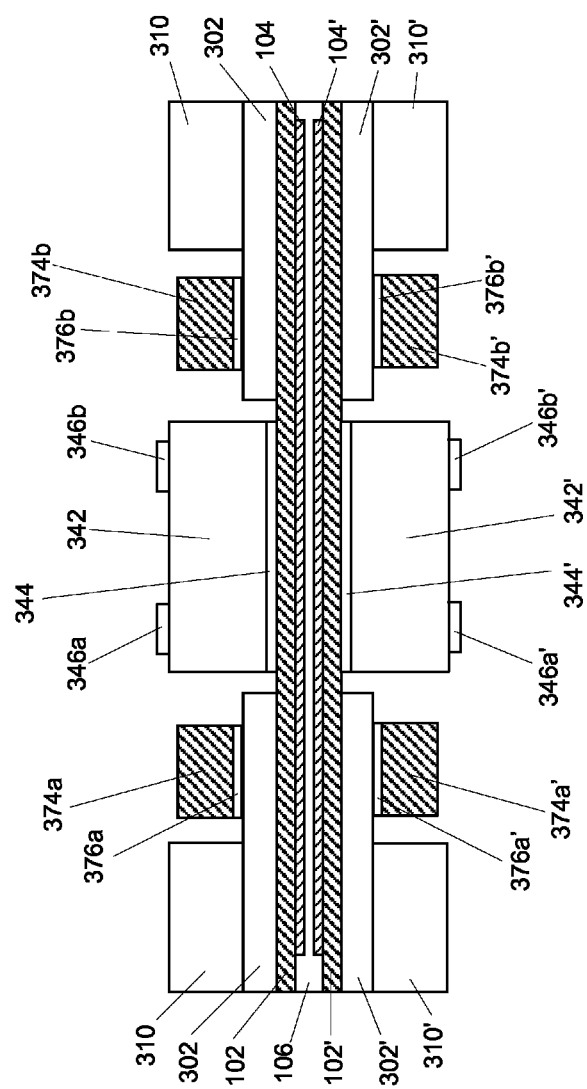

As shown in FIG. 31, a first microelectronic device 342 may be attached by a back surface 350 thereof with an adhesive material 344 to the carrier first surface 108 within the first sacrificial material layer opening 332. The first microelectronic device 342 may have at least one contact land (shown as elements 346a and 346b) on an active surface 348 thereof. A second microelectronic device 342' may be attached by a back surface 350' with an adhesive material 344' to the carrier second surface 108' within the second sacrificial material layer opening 332'. The second microelectronic device 342' may have at least one contact land (shown as elements 346a' and 346b') on an active surface 348' thereof. The microelectronic devices may be any desired devices, including but not limited to a microprocessor (single or multi-core), a memory device, a chipset, a graphics device, an application specific integrated circuit, or the like.

At least one secondary device may then be attached to a respective stand-off material. As further shown in FIG. 31, a first secondary device 374a may be attached to the first stand-off material layer 302 with an adhesive material 376a, a second secondary device 374b may be attached to the first stand-off material layer 302 with an adhesive material 376b, a third secondary device 374a' may be attached to the second stand-off material layer 302' with an adhesive material 376a', and a fourth secondary device 374b' may be attached to the second stand-off material layer 302b' with an adhesive material 376b'.

Figure 32:
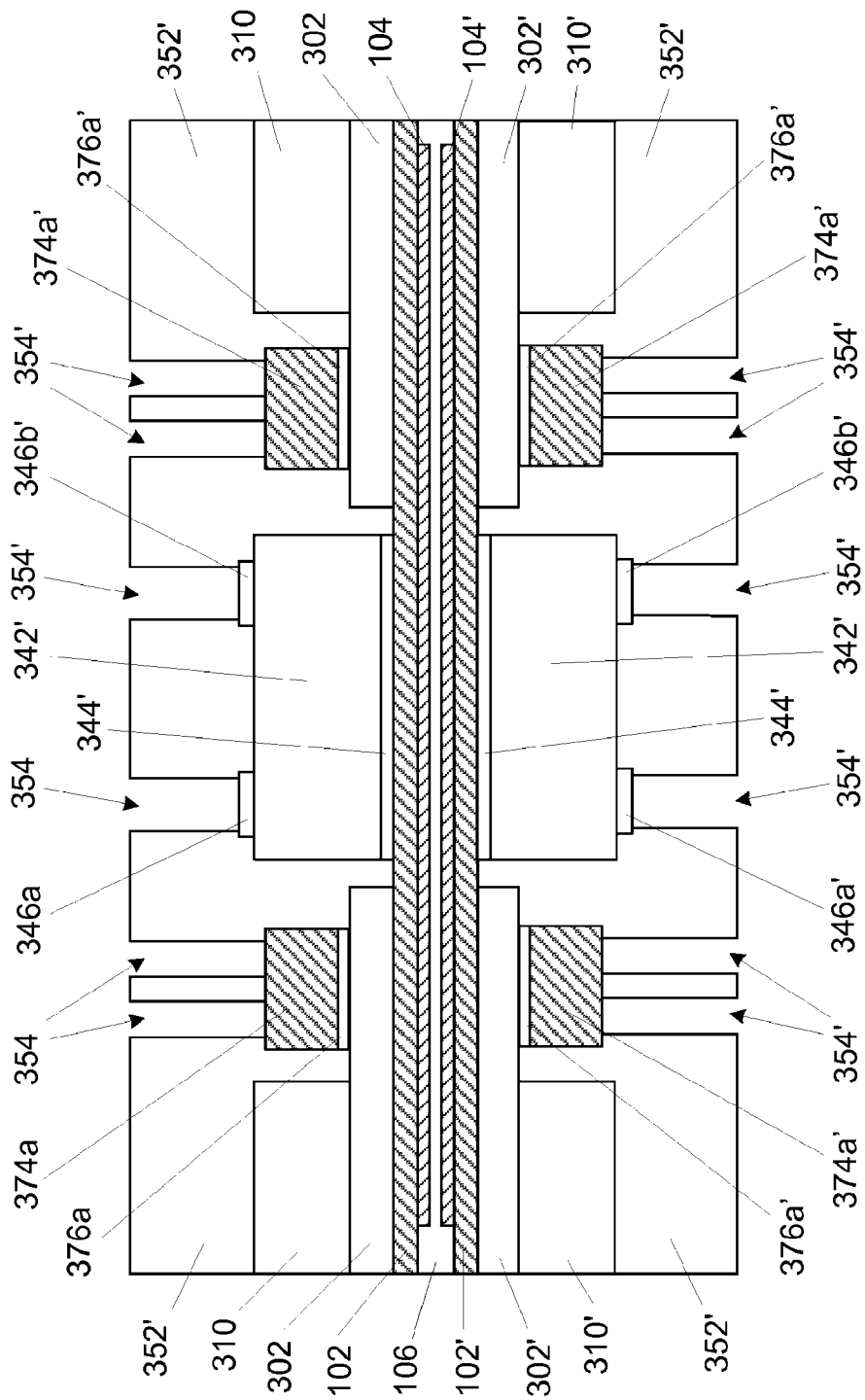

As shown in FIG. 32, a first dielectric layer 352 may be formed on the first microelectronic device 342, the first secondary device 374a, and the second secondary device 374b. A second dielectric layer 352' may be simultaneously formed on the second microelectronic device 342', the third secondary device 374a', and the fourth secondary device 374b. As also shown in FIG. 32, a plurality of openings 354 may be formed in the first dielectric layer 352 to expose at least a portion of each opening's 354 respective the microelectronic device contact lands 346a and 346b, the first secondary device 374a, and the second secondary device 374b. A plurality of openings 354' may be formed in the second dielectric layer 352' to expose at least a portion of each opening's 354' respective microelectronic device contact lands 346a' and 346b', third secondary device 374a', or fourth secondary device 374b'. In one embodiment, the first dielectric layer 352 and the second dielectric layer 352' may comprise silica-filled epoxy. The openings 354 and 354' may be formed by any technique known in the art including but not limited to laser drilling, ion drilling, etching, and the like.

Figure 33:
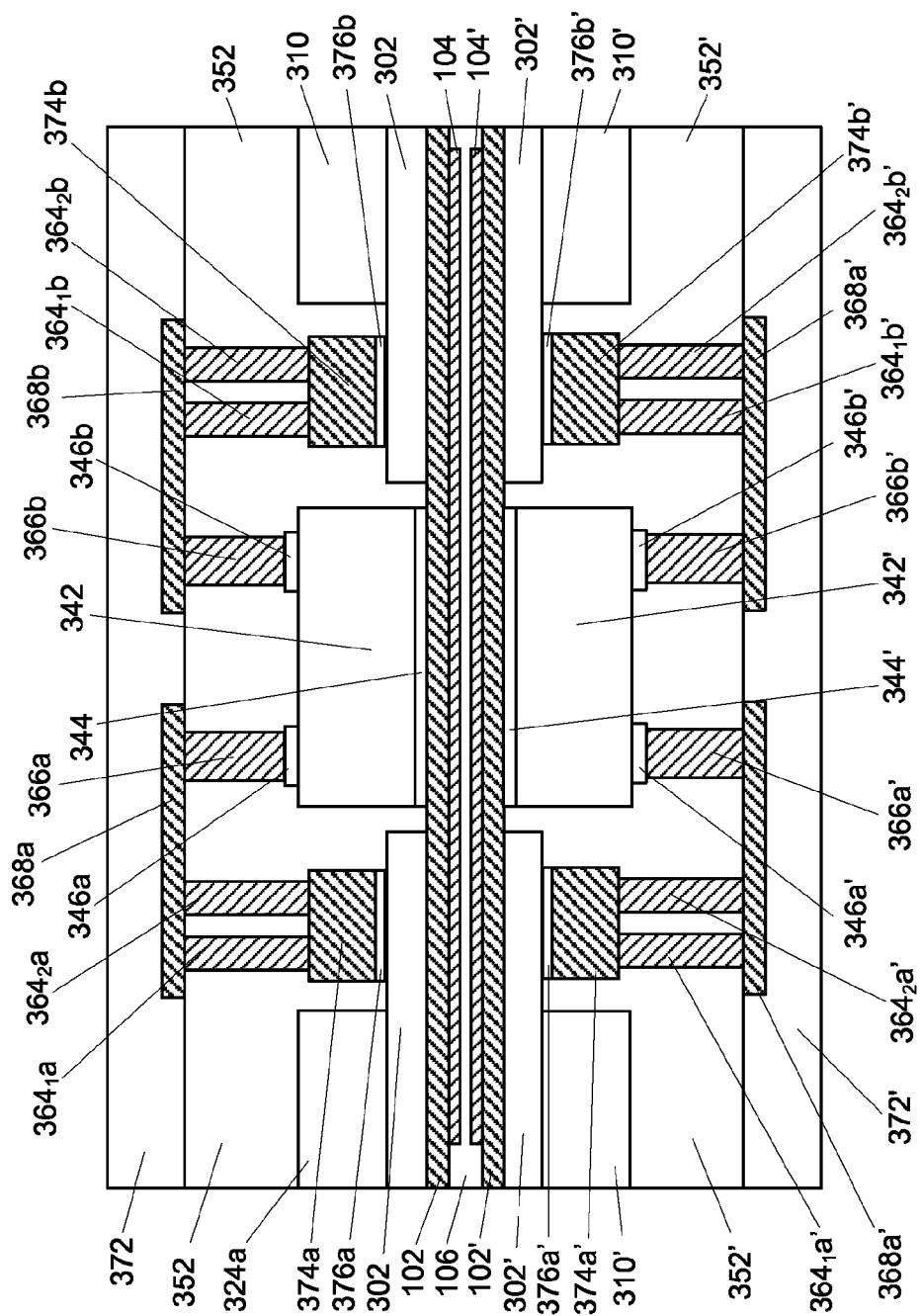

As shown in FIG. 33, a conductive material may be disposed within the first dielectric material layer openings 354 (see FIG. 32), by any technique known in the art, to form a first microelectronic device contact land first conductive via 366a, a first microelectronic device contact land second conductive via 366b, a first secondary device first conductive via $364_1a$, a first secondary device second conductive via $364_2a$, a second secondary device first conductive via $364_1b$ and a second secondary device second conductive via $364_2b$. The conductive material may also be simultaneously disposed within the second dielectric material layer openings 354' (see FIG. 32) to form a second microelectronic device contact land first conductive via 366a', a second microelectronic device contact land second conductive via 366b', a third secondary device first conductive via $364_1a'$, a third secondary device second conductive via $364_2b'$, a fourth secondary device first conductive via $364_1b'$, and a fourth secondary device second conductive via $364_2b'$. As further shown in FIG. 33, conductive traces may be formed to electrically connect various conductive vias. As illustrated, a first conductive trace 368a may be formed to electrically connect at least one of the first secondary device first conductive via $364_1a$ and the first secondary device second conductive via $364_2a$, and the first microelectronic device contact land first conductive via 366a. A second conductive trace 368b may be formed to electrically connect at least one of the second secondary device first conductive via $364_1b$ and the second secondary device second conductive via $364_2b$, and the first microelectronic device contact land second conductive via 366b. Further, a third conductive trace 368a' may be formed to electrically connect at least one of the third secondary device first conductive via $364_1a'$ and the third secondary device second conductive via $364_2a'$, and the second microelectronic device contact land first conductive via 366a'. A fourth conductive trace 368b' may be formed to electrically connect at least one of the fourth secondary device first conductive via $364_1b'$ and the fourth secondary device second conductive via $364_2b'$, and the second microelectronic device contact land second conductive via 366b'. Thus, the connection of the various conductive vias and conductive traces form electrically conductive paths between the secondary devices pads and the microelectronic device. The conductive traces (e.g. elements 368a, 368b, 368a', and 368b') may be any appropriate conductive material.

It is understood that the additional dielectric layers, conductive vias, and conductive traces may be built up to form a desired number of layers. Once a desired number of layers are formed, exterior layers, such as a glass cloth layers, may be formed. As shown in FIG. 33, a first exterior layer 372 may be formed on the first dielectric layer 352 and a second exterior layer 372' may be formed on the second dielectric layer 352'. The exterior layers (i.e. first exterior layer 372 and second exterior layer 372') may be used to engineer inherent warpages/stresses in microelectronic packages, as will be understood to those skilled in the art.

Figure 34:
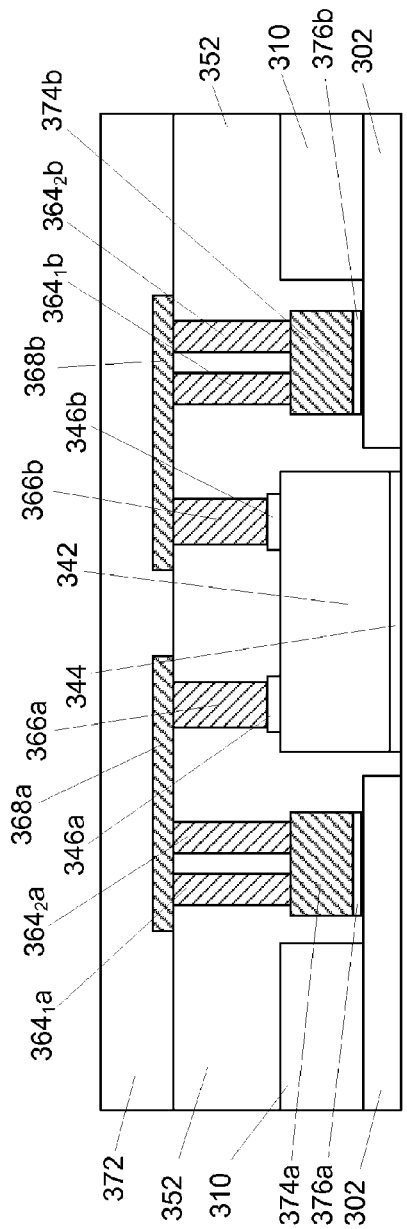

The structures thus formed on the carrier first surface 108 and on the carrier second surface 108' may be separated from one another with a depaneling process, as known in the art. FIG. 34 illustrates the structure formed on the carrier first surface 108 after depaneling.

Figure 35:
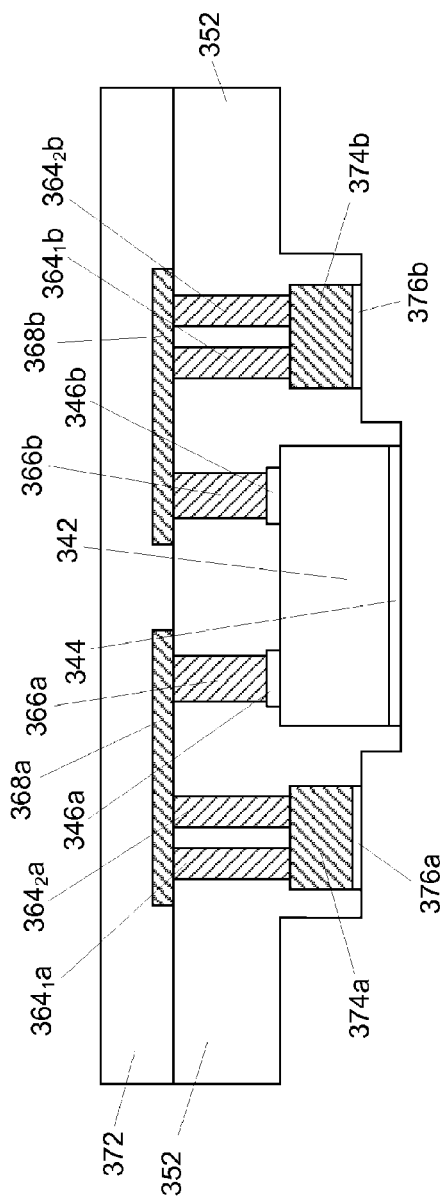

As shown in FIG. 35, the first stand-off material layer 302 and the first sacrificial material layer 310 may be removed, such as by a solvent release. The first microelectronic device adhesive material layer 344, the first secondary device adhesive material 376a, and the second secondary device adhesive material 376b (see FIG. 34) may then be removed, such as by plasma ashing, as shown in FIG. 36, to form a microelectronic device package 380.

It is understood that a controlled plasma ashing could be used to simultaneously remove the first stand-off material layer 302, the first sacrificial material layer 310, the first microelectronic device adhesive material layer 344, the first secondary device adhesive material 376a, and the second secondary device adhesive material 376b. It is further understood that a controlled plasma ashing could be used to remove the first stand-off material layer 302, the first microelectronic device adhesive material layer 344, the first secondary device adhesive material 376a, and the second secondary device adhesive material 376b, while leaving the first sacrificial material layer 310 in place, as shown in FIG. 37, to form a microelectronic device package 390.

As can be seen in FIGS. 36 and 37, the process of FIGS. 26-37 may result in a secondary device (e.g. elements 374a and 374b) which is disposed within a thickness T of the first microelectronic device 342 (i.e. between the first microelectronic device active surface 348 and the first microelectronic device back surface 350).

Although the embodiment illustrated in FIGS. 28-37 show in stand-off layer being formed for a microelectronic device package, it is understood that multiple stand-off material layers could be formed and various pockets or cavities could be formed within the materials to allow for the creation of various package architectures for microelectronic device and package stacking and also multi-device embedding, as will be understood to those skilled in the art.

It is understood that the subject matter of the present description is not necessarily limited to specific applications illustrated in FIGS. 1-37. The subject matter may be applied to other microelectronic device packaging applications. Furthermore, the subject matter may also be used in any appropriate application outside of the microelectronic device fabrication field. Moreover, the subject matter of the present description may be a part of a larger bumpless build-up package, it may include multiple stacked microelectronic dice, it may be formed at a wafer level, or any number of appropriate variations, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of forming a microelectronic device package comprising:
   forming a stand-off material layer on a carrier;
   forming an opening through the stand-off material layer to expose a portion of the carrier;
   forming a sacrificial material layer on the stand-off material layer and within the stand-off material layer opening;
   forming an opening through the sacrificial material layer to expose a portion of the stand-off material layer and a portion of the carrier;
   attaching a microelectronic device to the carrier, wherein the microelectronic device has an active surface, an opposing back surface, and a thickness defined by the distance between the microelectronic device active surface and the microelectronic device back surface;
   attaching at least one secondary device to the at least one stand-off material layer, wherein the at least one secondary device is position within the thickness of the microelectronic device;
   disposing a dielectric layer over the microelectronic device and the at least one secondary device;
   forming an electrically conductive path between the at least one secondary device pad and the microelectronic device; and
   removing the at least one stand-off.

2. The method of claim 1, wherein attaching the at least one secondary device to the at least one stand-off material layer comprises attaching a capacitor to the at least one stand-off material layer.

3. The method of claim 1, further including removing the sacrificial material layer.

4. The method of claim 1, wherein forming an electrically conductive path between the at least one secondary device pad and the microelectronic device comprises:
   forming at least one opening through the dielectric layer to the secondary device pad;
   forming at least one opening through the dielectric layer to the microelectronic device;
   disposing a conductive material within the openings to form at least one secondary device pad conductive via and at least one microelectronic device conductive via; and
   forming at least one conductive trace between the at least one secondary device pad conductive via and the at least one microelectronic device conductive via.

5. The method of claim 1, wherein disposing a dielectric layer over the microelectronic device and the at least one secondary device pad comprises disposing a silica-filled epoxy over the microelectronic device and the at least one secondary device pad.

6. The method of claim 1, wherein forming the stand-off material layer on the carrier comprises forming a photoresist stand-off material layer on the carrier.

7. The method of claim 6, further comprising crosslinking the photoresist stand-off material layer.

8. The method of claim 1, wherein disposing the dielectric layer over the microelectronic device and the at least one secondary device comprises disposing a photoresist dielectric layer over the microelectronic device and the at least one secondary device.

9. A method of forming a microelectronic device package comprising:
   forming a sacrificial material layer on a carrier;
   forming an opening through the sacrificial material layer to expose a portion of the carrier;
   forming at least one secondary device pad on the sacrificial material layer;
   attaching a microelectronic device to the carrier within the sacrificial material layer opening, wherein the microelectronic device has an active surface, an opposing back surface, and a thickness defined by the distance between the microelectronic device active surface and the microelectronic device back surface;
   disposing a dielectric layer over the microelectronic device and the at least one secondary device pad;
   forming an electrically conductive path between the at least one secondary device pad and the microelectronic device;
   removing the sacrificial material layer; and
   attaching a secondary device to the at least one secondary device pad, wherein the secondary device is disposed within the thickness of the microelectronic device.

10. The method of claim 9, wherein attaching the secondary device to the at least one secondary device pad comprises attaching a capacitor to the at least one secondary device pad.

11. The method of claim 9, wherein forming the electrically conductive path between the at least one secondary device pad and the microelectronic device comprises:
   forming at least one opening through the dielectric layer to the secondary device pad;
   forming at least one opening through the dielectric layer to the microelectronic device;
   disposing a conductive material within the openings to form at least one secondary device pad conductive via and at least one microelectronic device conductive via; and
   forming at least one conductive trace between the at least one secondary device pad conductive via and the at least one microelectronic device conductive via.

12. The method of claim 9, wherein disposing the dielectric layer over the microelectronic device and the at least one secondary device pad comprises disposing a silica-filled epoxy over the microelectronic device and the at least one secondary device pad.

13. The method of claim 9, wherein forming the sacrificial material layer on the carrier comprises forming a photoresist material layer on the carrier.

14. A method of forming a microelectronic device package comprising:
   forming at least one stand-off on a carrier;
   forming a sacrificial material layer on the carrier and the at least one stand-off;
   forming an opening through the sacrificial material layer to expose a portion of the carrier;
   attaching a microelectronic device to the carrier within the sacrificial material layer opening, wherein the microelectronic device has an active surface, an opposing back surface, and a thickness defined by the distance between the microelectronic device active surface and the microelectronic device back surface;
   attaching at least one secondary device to the at least one stand-off, wherein the at least one secondary device is position within the thickness of the microelectronic device.;
   disposing a dielectric layer over the microelectronic device and the at least one secondary device;

forming an electrically conductive path between the at least one secondary device pad and the microelectronic device;

removing the at least one stand-off; and removing the sacrificial material layer.

15. The method of claim 14, wherein attaching at least one secondary device to the at least one stand-off comprises attaching a capacitor to the at least one stand-off.

16. The method of claim 14, wherein forming the electrically conductive path between the at least one secondary device pad and the microelectronic device comprises:

forming at least one opening through the dielectric layer to the secondary device pad;

forming at least one opening through the dielectric layer to the microelectronic device;

disposing a conductive material within the openings to form at least one secondary device pad conductive via and at least one microelectronic device conductive via; and forming at least one conductive trace between the at least one secondary device pad conductive via and the at least one microelectronic device conductive via.

17. The method of claim 14, wherein disposing a dielectric layer over the microelectronic device and the at least one secondary device pad comprises disposing a silica-filled epoxy over the microelectronic device and the at least one secondary device pad.

18. The method of claim 14, wherein forming the sacrificial material layer on the carrier comprises forming a photoresist material layer on the carrier.

* * * * *